US012607653B2

(12) United States Patent
Ushida et al.

(10) Patent No.: US 12,607,653 B2
(45) Date of Patent: Apr. 21, 2026

(54) MAGNETIC SENSOR AND CURRENT DETECTION DEVICE

(71) Applicant: Asahi Kasei Microdevices Corporation, Tokyo (JP)

(72) Inventors: Saki Ushida, Tokyo (JP); Masato Inoue, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 147 days.

(21) Appl. No.: 18/415,576

(22) Filed: Jan. 17, 2024

(65) Prior Publication Data

US 2024/0329096 A1 Oct. 3, 2024

(30) Foreign Application Priority Data

Mar. 30, 2023 (JP) ................................. 2023-054883
Nov. 28, 2023 (JP) ................................. 2023-200559

(51) Int. Cl.
*G01R 15/20* (2006.01)
*G01R 19/00* (2006.01)
(52) U.S. Cl.
CPC ....... *G01R 15/205* (2013.01); *G01R 19/0092* (2013.01)
(58) Field of Classification Search
CPC .......................... G01R 15/205; G01R 19/0092
See application file for complete search history.

(56) References Cited

U.S. PATENT DOCUMENTS

| 2011/0025320 | A1* | 2/2011 | Ohta | ...................... H10B 61/00 |
| | | | | 324/252 |
| 2017/0016966 | A1 | 1/2017 | Goodwin | |
| 2023/0068352 | A1* | 3/2023 | Hiraki | .................. G01R 33/093 |

FOREIGN PATENT DOCUMENTS

| JP | S648668 | U | 1/1989 |
| JP | 2010016260 | A | 1/2010 |
| JP | 5021764 | B2 | 9/2012 |
| JP | 2015132567 | A | 7/2015 |
| WO | 2015107949 | A1 | 7/2015 |

* cited by examiner

*Primary Examiner* — Dominic E Hawkins

(57) ABSTRACT

A magnetic sensor 50 includes: a resistor arm Ra having: a plurality of magneto resistive elements 51a; an electrode piece 52a which connects upper surfaces of two magneto resistive elements 51a; and an electrode piece 53a which connects lower surfaces of two magneto resistive elements 51a, where the plurality of magneto resistive elements 51a are alternately connected in array sequence by the electrode pieces 52a and 53a; and a resistor arm Rb having: a plurality of magneto resistive elements 51b; an electrode piece 52b which connects upper surfaces of two magneto resistive elements 51b; and an electrode piece 53b which connects lower surfaces of two magneto resistive elements 51b, where the plurality of magneto resistive elements 51b are alternately connected in array sequence by the electrode pieces 52b and 53b.

25 Claims, 27 Drawing Sheets

<u>100</u>

MAGNETIC SENSOR AND CURRENT DETECTION DEVICE

The contents of the following patent application(s) are incorporated herein by reference:
NO. 2023-054883 filed in JP on Mar. 30, 2023
NO. 2023-200559 filed in JP on Nov. 28, 2023

BACKGROUND

1. Technical Field

The present invention relates to a magnetic sensor and a current detection device.

2. Related Art

A magnetic sensor is known which has a Wheatstone bridge circuit composed of four resistor arms each of which includes a magneto resistive element (TMR) and which detects a magnetic field intensity by inputting a drive voltage from a pair of power source nodes and obtaining a differential voltage from a pair of output nodes (see Patent Document 1). In a magnetic sensor with such a configuration, connecting a plurality of TMRs in series to constitute each of the resistor arms can improve a DC voltage resistance and an ESD voltage resistance of the magnetic sensor. However, there is a concern that, as a result of a chip area (equal to a magneto sensitive portion area) increasing, in other words, a closed loop formed by the four resistor arms increasing, and a large number of magnetic fluxes passing through the inside of the closed loop, not only an induced electromotive force is generated, resulting in a di/dt noise, but also a common-mode signal is generated due to a magnetic field distribution on the magneto sensitive portion, resulting in a differential amplification noise.

Patent Document 1: International Publication No. 2015/107949

DESCRIPTION OF EXEMPLARY EMBODIMENTS

Hereinafter, the present invention will be described through embodiments of the invention, but the following embodiments do not limit the invention according to claims. In addition, not all combinations of features described in the embodiments are essential to a solution of the invention.

First Embodiment

Figure 1A:
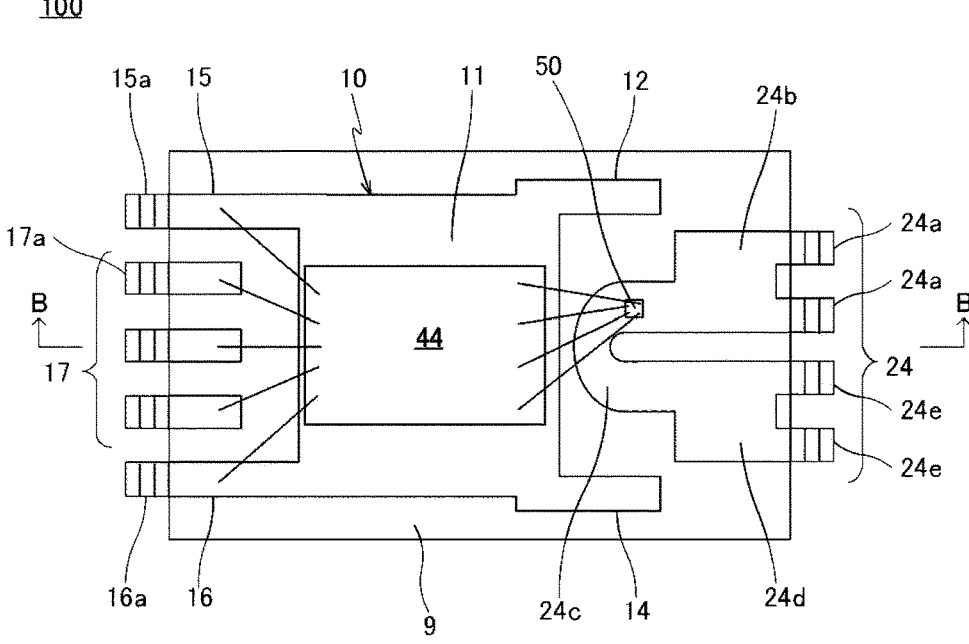
FIG. 1A shows an internal configuration of a current detection device according to a first embodiment in a top view.
Figure 1B:
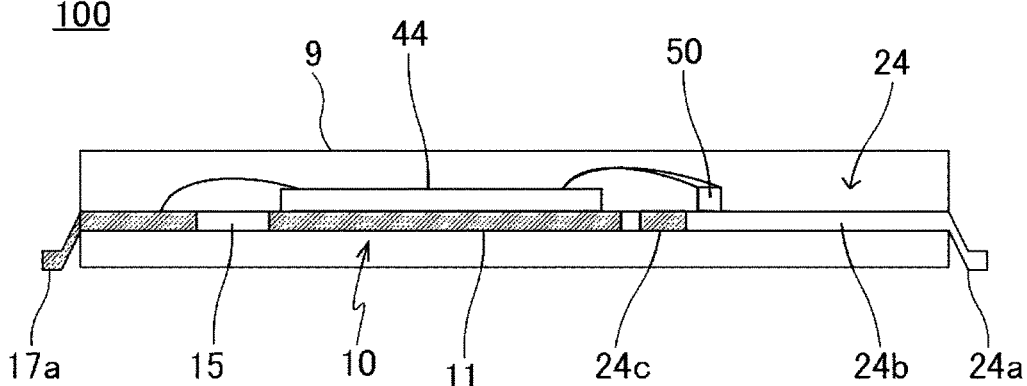
FIG. 1B shows the internal configuration of the current detection device according to the first embodiment in a side view.

FIG. 1A and FIG. 1B respectively show an internal configuration of a current detection device 100 according to a first embodiment through a package 9 in a top view and a side view. Here, FIG. 1B shows a cross-sectional structure of the current detection device 100 with respect to a reference line in FIG. 1A. It should be noted that the upward/downward direction in FIG. 1A is defined as the longitudinal direction, the rightward/leftward direction in FIG. 1A and FIG. 1B is defined as the lateral direction, and the upward/downward direction in FIG. 1B is defined as the height direction. The current detection device 100 is a sensor which measures an amount of current by using a magnetic sensor 50 to detect a magnetic field generated around a conductor 24 as a result of a to-be-measured current flowing through the conductor 24, and can suppress especially a di/dt noise due to an induced electromotive force and/or a differential amplification noise caused by spread of a magnetic field distribution. The current detection device 100 includes the package 9, a base 10, a plurality of device terminals 17, the conductor 24, the magnetic sensor 50, and a signal processing device 44.

The package 9 is a member which encapsulates therein and protects each portion constituting the current detection device 100, except for two device terminals 15 and 16 included in the base 10 which will be described below, the plurality of device terminals 17, and respective terminal portions of the conductor 24. The package 9 is formed into a flat cuboid through molding using, for example, encapsulation resin with excellent electrical insulation such as epoxy.

The base 10 is a plate-like member which supports the signal processing device 44 and to which an insulating member 18 is fixed. The base 10 is formed of, for example, metal with high thermal conductivity into a plate, especially in order to release heat generated by the signal processing device 44. The base 10 has a body 11, protruding portions 12 and 14, and the device terminals 15 and 16.

The body 11 is a part which supports the signal processing device 44. The body 11 has a substantially rectangular shape with its size sufficiently large to support the signal processing device 44 in a plan view, as one example.

The protruding portions 12 and 14 are respectively extended toward the right from one end (that is, an upper end in FIG. 1A) and another end (that is, a lower end in FIG. 1A) of one lateral side (that is, a right side in FIG. 1A) of the body 11. When the magnetic sensor 50 is arranged around the conductor 24, the insulating member 18 can be fixed between the protruding portions 12 and 14, to arrange the magnetic sensor 50 on the insulating member 18.

The device terminals 15 and 16 are parts for outputting, to an external device, a detection result of the to-be-measured current outputted from the signal processing device 44. The device terminals 15 and 16 are extended toward the left from one end (that is, an upper end in FIG. 1A) and another end (that is, a lower end in FIG. 1A) of another lateral side (that is, a left side in FIG. 1A) of the body 11. The device terminals 15 and 16 respectively have terminal portions 15a and 16a which are formed at their ends by bending their ends downward by a bending process and further bending their edges horizontally.

The base 10 is encapsulated in the package 9 with the terminal portions 15a and 16a of the device terminals 15 and 16 protruding from a side surface of the package 9.

The plurality of device terminals 17, together with the device terminals 15 and 16, are secondary conductors for outputting, to the external device, the detection result of the to-be-measured current outputted from the signal processing device 44. In addition, the plurality of device terminals 17, together with the device terminals 15 and 16, are used to give a power source or an operating parameter to the signal processing device 44. In the present embodiment, as one example, three device terminals 17 are arrayed, with their longitudinal sides being oriented in the lateral direction, at regular intervals between the device terminals 15 and 16 of the base 10. The device terminals 17 are formed of metal into rectangular plates, and respectively have terminal portions 17a which are formed at their ends by bending their ends downward by a bending process and further bending their edges horizontally, similarly to the device terminals 15 and 16.

The conductor 24 is a primary conductor which forms a current path through which the to-be-measured current flows. In the present embodiment, the conductor 24 has a substantially U shape in which the conductor 24 passes through the inside of the package 9 from a current terminal 24a which is provided on one side (that is, an upper side in FIG. 1A) of the right side of the package 9, returns to the right side, and reaches a current terminal 24e which is provided on another side (that is, a lower side in FIG. 1A) of the right side. The conductor 24 is formed of metal. The conductor 24 includes the current terminals (also simply referred to as terminal portions) 24a and 24e, barrels 24b and 24d, and a curved portion 24c.

The terminal portions 24a and 24e protrude from the right side of the package 9, and by bending their ends downward by a bending process and further bending their edges horizontally, terminals for inputting a current are formed.

The barrels 24b and 24d are parts which connect the terminal portions 24a and 24e to the curved portion 24c. The barrels 24b and 24d are formed into rectangles as one example, two barrels 24b and 24d are connected to the right side while being spaced apart from each other, and legs of the curved portion 24c are connected to the left side.

The curved portion 24c has two legs and a connecting portion which connects these two legs. The two legs have longitudinal widths smaller than the barrels 24b and 24d. The connecting portion of the curved portion 24c is curved into a substantially circular arc, and from its both ends, the two legs extend in the lateral direction. It should be noted that the curved portion 24c may be bent into a rectangular U.

The conductor 24 is encapsulated in the package 9 with the curved portion 24c being arranged between the protruding portions 12 and 14 of the base 10 and with the edges of the terminal portions 24a and 24e protruding from the right side of the package 9.

The magnetic sensor 50 is a sensor which detects a magnetic field generated by the to-be-measured current passed through the conductor 24. The magnetic sensor 50 is configured to detect a longitudinal magnetic field (one example of a horizontal magnetic field) generated around the conductor 24, and is arranged on one leg of the conductor 24, as one example.

Figure 2:
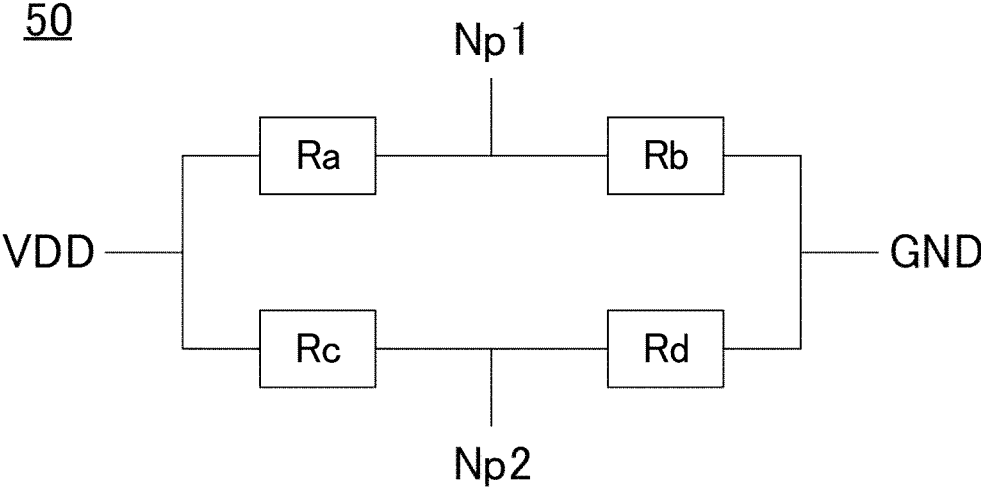
FIG. 2 shows a circuit configuration of a magnetic sensor.

FIG. 2 shows a circuit configuration of a magnetic sensor 50. The magnetic sensor 50 includes four resistor arms Ra to Rd. Here, the four resistor arms Ra to Rd are connected in a Wheatstone bridge circuit pattern. That is, one end of the resistor arm Ra is connected to one end of the resistor arm Rb to form an output terminal Np1, one end of the resistor arm Rc is connected to one end of the resistor arm Rd to form an output terminal Np2, another end of the resistor arm Ra is connected to another end of the resistor arm Rc to form a power source terminal VDD, and another end of the resistor arm Rb is connected to another end of the resistor arm Rd to form a ground terminal GND.

It should be noted that magnetic field detection directions of the resistor arm Ra and the resistor arm Rd are the same, and in the present example, they are upward (or downward) longitudinally in FIG. 1A. In addition, magnetic field detection directions of the resistor arm Rb and the resistor arm Rc are the same, and in the present example, they are downward (or upward) longitudinally in FIG. 1A. In addition, the magnetic field detection directions of the resistor arm Ra and the resistor arm Rd are opposite to the magnetic field detection directions of the resistor arm Rb and the resistor arm Rc. Each of the four resistor arms Ra to Rd is formed by, for example, using one magneto resistive element 51 or connecting a plurality of magneto resistive elements 51a to 51*d* in series. It should be noted that, as a magneto resistive element, for example, a tunneling magneto resistive element or a huge magneto resistive element can be employed.

Figure 3:
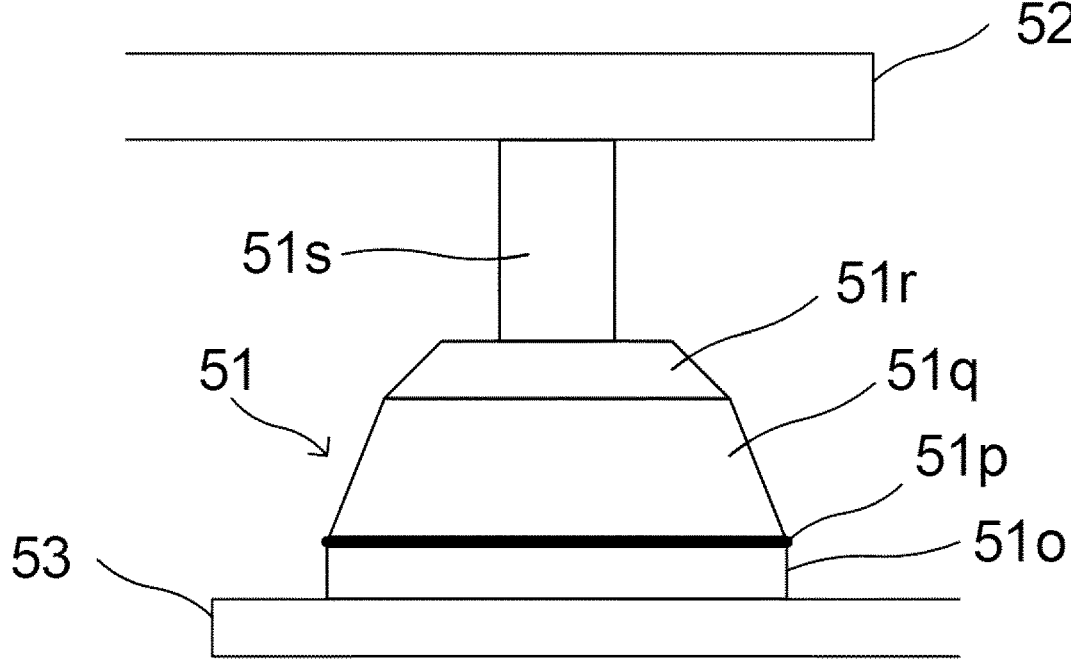
FIG. 3 shows a configuration of a magneto resistive element (TMR) in a side view.

FIG. 3 shows a configuration of a magneto resistive element 51 (51*a* to 51*d*) in a side view. The magneto resistive element 51 is an element with a resistance value varying depending on application of a magnetic field, and has a fixed layer 51*o*, a tunnel layer 51*p*, a free layer 51*q*, and a cap layer 51*r*. The fixed layer 51*o* is a magnetic film whose direction of magnetization is fixed. The fixed layer 51*o* is magnetized such that its magnetization is oriented in a uniaxial direction in a plane on which the magnetic film spreads (also referred to as a magneto sensitive surface) or in a direction perpendicular to the magneto sensitive surface. The direction of magnetization of the fixed layer 51*o* defines a magnetic field detection direction of the magneto resistive element 51. The tunnel layer 51*p* is, for example, a non-magnetic insulating film with a thickness of several nano-meters. The free layer 51*q* is a magnetic film whose direction of magnetization changes depending on an external magnetic field. It should be noted that, as a material of the magnetic film, for example, an alloy containing at least one of Co, Fe, B, Ni, or Si, and more specifically, cobalt iron (CoFe), cobalt iron boron (CoFeB), or nickel iron (NiFe) can be used. The fixed layer 51*o*, the tunnel layer 51*p*, and the free layer 51*q* are laminated to constitute a laminated body. Here, a current flows in the element in a laminated direction as a result of electrons moving from the fixed layer 51*o* to the free layer 51*q* or from the free layer 51*q* to the fixed layer 51*o* by tunneling through the tunnel layer 51*p*. The cap layer 51*r* is a member which covers the laminated body from above, and as its material, for example, an alloy containing at least one of Ta, Ru, Pt, Mn, Ir, Mg, Cu, Fe, Ni, Cr, Fe, Co, or Al, and more specifically, platinum manganese (PtMn) or iridium manganese (IrMn) can be used. It should be noted that a region around the magneto resistive element 51 is covered with an insulator (not shown), for example, silicon dioxide ($SiO_2$), silicon nitride (SiN), or the like.

When the external magnetic field is applied to the magneto resistive element 51, due to a magneto resistive effect (MR effect), the direction of magnetization of the free layer 51*q* changes depending on a direction and intensity of the magnetic field, that is, the direction of magnetization of the free layer 51*q* changes with respect to the direction of magnetization of the fixed layer 51*o*, so that the resistance value between the fixed layer 51*o* and the free layer 51*q* varies. Especially, when the direction of magnetization of the free layer 51*q* is the same as the direction of magnetization of the fixed layer 51*o* (the magnetizations of the two layers are parallel), the resistance value is small, and when the direction of magnetization of the free layer 51*q* is opposite to the direction of magnetization of the fixed layer 51*o* (the magnetizations of the two layers are antiparallel), the resistance value is great.

It should be noted that connecting a plurality of magneto resistive elements 51 in series can improve a DC voltage resistance. Here, connecting an electrode piece 52 to the cap layer 51*r* via an electrode rod 51*s* and connecting an electrode piece 53 to a lower surface of the fixed layer 51*o* can connect the magneto resistive element 51 to other magneto resistive elements 51 via these electrode pieces 52 and 53.

When a to-be-measured current flows through a conductor 24 to generate the magnetic field around the conductor 24, the longitudinal magnetic field is applied to (the magneto resistive elements 51*a* to 51*d* included in) resistor arms Ra to Rd of a magnetic sensor 50 arranged on the conductor 24, to vary their respective resistance values. For example, the resistance values of the resistor arms Ra and Rd increase (or decrease), and the resistance values of the resistor arms Rb and Rc decrease (or increase). As a result, a resistance balance between the resistor arms Ra to Rd is disrupted. Here, a magnetic field intensity can be detected by inputting a drive voltage to the power source terminal VDD with respect to the ground terminal GND and detecting a differential voltage outputted from between the output terminals Np1 and Np2. It should be noted that a configuration of the magnetic sensor 50 will be further described below.

The magnetic sensor 50 is connected to a signal processing device 44 through wire bonding, and outputs a voltage corresponding to the detected magnetic field intensity to the signal processing device 44 as an output signal.

The signal processing device 44 is a device which processes the output signal of the magnetic sensor 50 to calculate an amount of the to-be-measured current passed through the conductor 24. The signal processing device 44 may incorporate a memory, a sensitivity correction circuit, an offset correction circuit which corrects an offset of an output, an amplifying circuit which amplifies the output signal from the magnetic sensor 50, and a temperature correction circuit which corrects the output according to temperature. The signal processing device 44 is supported on a body 11 of a base 10, and is connected to device terminals 15 and 16 of the base 10 and three device terminals 17 through wire bonding. As a result, the signal processing device 44 outputs a calculation result on the amount of the to-be-measured current passed through the conductor 24 via the device terminals 15, 16, and 17.

A method for manufacturing the current detection device 100 will be described.

First, one piece of metal plate is pressed to form a pattern of the base 10, a plurality of device terminals 17, and the conductor 24. This pattern includes the base 10, the plurality of device terminals 17, and the conductor 24, with their terminal portions being coupled to the inside of a rectangular frame.

Next, a step providing process is performed on the pattern, to provide steps to the device terminals 15 and 16 of the base 10, the plurality of device terminals 17, and the conductor 24. As a result, with respect to the frame and their terminal portions coupled to the frame, the inner part of the pattern is raised.

Next, the magnetic sensor 50 and the signal processing device 44 are installed on the pattern. Here, the magnetic sensor 50 is arranged on one leg of the conductor 24. The signal processing device 44 is arranged on the body 11 of the base 10.

Next, through wire bonding, the magnetic sensor 50 is connected to the signal processing device 44, and the signal processing device 44 is connected to the device terminals 15, 16, and 17.

Next, the pattern is molded, except for the frame as well as the terminal portions of the base 10, the plurality of device terminals 17, and the conductor 24 coupled to the frame. As a result, a package 9 is formed, and encapsulates therein the magnetic sensor 50, the signal processing device 44, and the inner part of the pattern on which these are installed.

Finally, the frame exposed on the outside of the package 9 is cut off from the pattern. As a result, the base 10, the plurality of device terminals 17, and the conductor 24 are separated from each other, to finalize the current detection device 100.

Figure 4A:
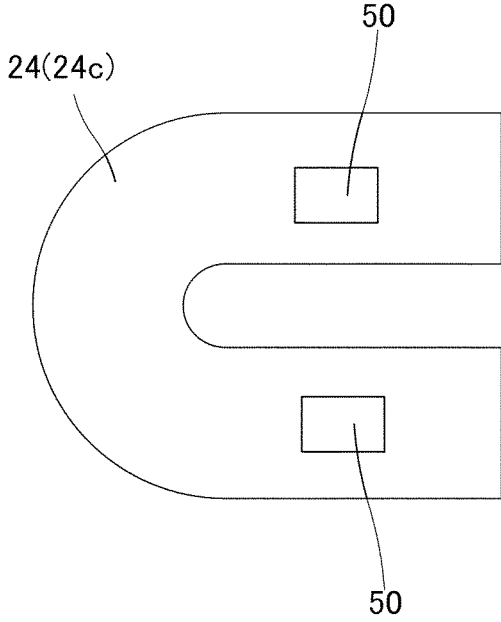
FIG. 4A shows an example of arrangement of a magnetic sensor which detects a horizontal magnetic field.

FIG. 4A shows an example of arrangement of a magnetic sensor 50. The magnetic sensor 50 can be arranged on one of two legs of a conductor 24, as described above. Alternatively, it may be arranged on another of the two legs. In addition, it is more preferable to arrange it on each of the two legs of the conductor 24 because a disturbance magnetic field can be canceled. The magnetic sensor 50 arranged at such a position is configured to detect a horizontal magnetic field parallel to an upper surface of the conductor 24 (in the present example, the longitudinal magnetic field in FIG. 1A).

Figure 4B:
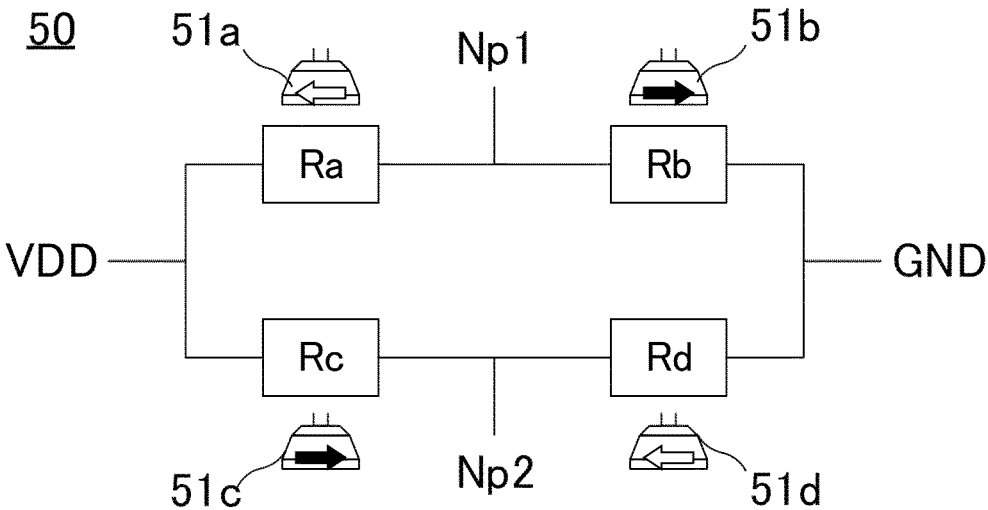
FIG. 4B shows a circuit configuration of and magnetic field detection directions of magneto resistive elements included in, the magnetic sensor in FIG. 4A.

FIG. 4B shows magnetic field detection directions of (magneto resistive elements 51a to 51d respectively included in) four resistor arms Ra to Rd included in the magnetic sensor 50 in FIG. 4A. The magnetic field detection directions of the resistor arm Ra (the magneto resistive element 51a) and the resistor arm Rd (the magneto resistive element 51d) are the same, and in the present example, they are each one uniaxial direction parallel to the upper surface of the conductor 24 (indicated by open arrows in the figure). The magnetic field detection directions of the resistor arm Rb (the magneto resistive element 51b) and the resistor arm Rc (the magneto resistive element 51c) are the same, and in the present example, they are each another uniaxial direction parallel to the upper surface of the conductor 24 (indicated by filled arrows in the figure). The magnetic field detection directions of the resistor arm Ra and the resistor arm Rd are opposite to the magnetic field detection directions of the resistor arm Rb and the resistor arm Rc. This allows the magnetic sensor 50 to detect the horizontal magnetic field generated on the upper surface of the conductor 24.

Figure 5A:
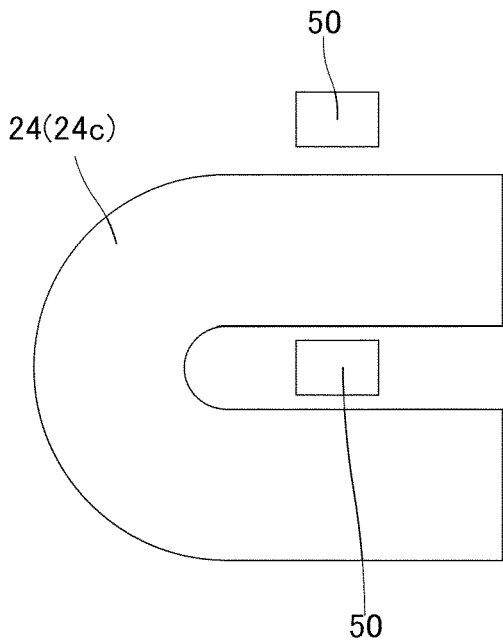
FIG. 5A shows an example of arrangement of a magnetic sensor which detects a vertical magnetic field.

FIG. 5A shows another example of arrangement of a magnetic sensor 50. The magnetic sensor 50 can be arranged in a region surrounded by a curved portion 24c of a conductor 24. Alternatively, it may be arranged near one of two legs of the conductor 24, or may be arranged near each of the two legs. Especially, it is more preferable to install it near one of the two legs of the conductor 24 because a disturbance magnetic field can be canceled. The magnetic sensor 50 arranged at such a position is configured to detect a vertical magnetic field perpendicular to an upper surface of the conductor 24 (in the present example, the magnetic field in the height direction in FIG. 1A).

It should be noted that the magnetic sensor 50 can be arranged near the conductor 24 by attaching an insulating member 18 to lower surfaces of protruding portions 12 and 14 of a base 10 to place the insulating member 18 between the protruding portions 12 and 14 and by supporting the magnetic sensor 50 on the insulating member 18. It should be noted that the insulating member 18 is formed of, as one example, a material with a high withstand voltage such as a polyimide tape, into a film.

In addition, the curved portion 24c of the conductor 24 may be raised with respect to barrels 24b and 24d by providing a step in the height direction by a step providing process (for example, half punching, etching, forming, coining, or the like). As a result, a bottom surface of the curved portion 24c is higher than an upper surface of the insulating member 18 attached to bottom surfaces of the protruding portions 12 and 14 of the base 10, and a primary conductor including the conductor 24 and the insulating member 18 connected to a secondary conductor including device terminals 15, 16, and 17 are spaced apart from each other, so that a high withstand voltage can be obtained between the primary conductor and the secondary conductor in a package 9.

Figure 5B:
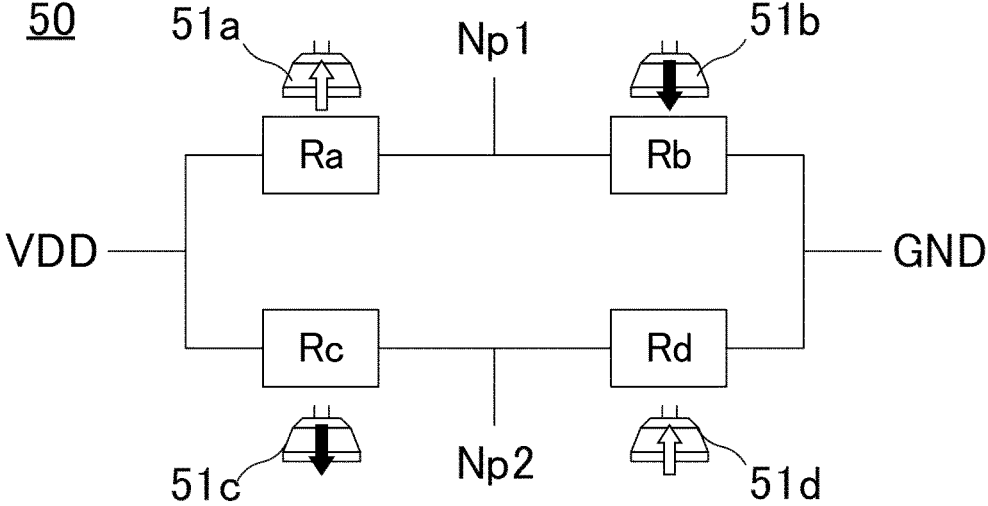
FIG. 5B shows a circuit configuration of and magnetic field detection directions of magneto resistive elements included in, the magnetic sensor in FIG. 5A.

FIG. 5B shows magnetic field detection directions of (magneto resistive elements 51a to 51d respectively included in) four resistor arms Ra to Rd included in the magnetic sensor 50 in FIG. 5A. The magnetic field detection directions of the resistor arm Ra (the magneto resistive element 51a) and the resistor arm Rd (the magneto resistive element 51d) are the same, and in the present example, they are upward perpendicularly to the upper surface of the conductor 24 (indicated by open arrows in the figure). The magnetic field detection directions of the resistor arm Rb (the magneto resistive element 51b) and the resistor arm Rc (the magneto resistive element 51c) are the same, and in the present example, they are downward perpendicularly to the upper surface of the conductor 24 (indicated by filled arrows in the figure). The magnetic field detection directions of the resistor arm Ra and the resistor arm Rd are opposite to the magnetic field detection directions of the resistor arm Rb and the resistor arm Rc. This allows the magnetic sensor 50 to detect the vertical magnetic field generated around the conductor 24.

Figure 6A:
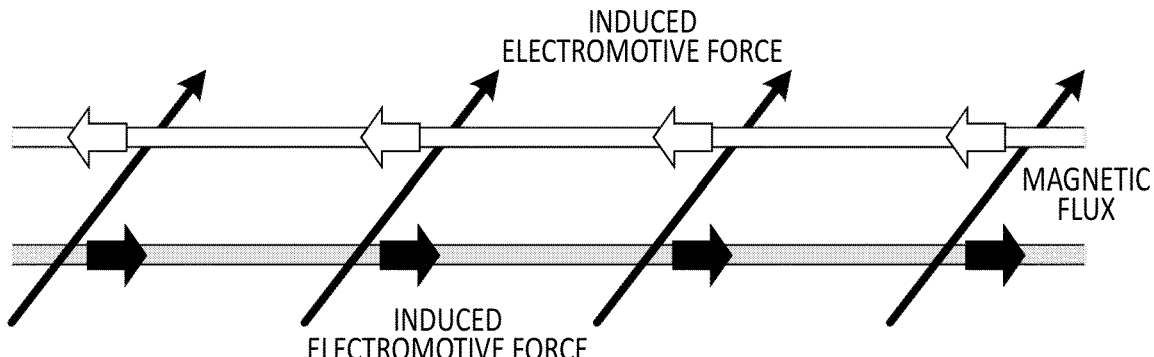
FIG. 6A shows a principle of generation of a di/dt noise caused by induced electromotive forces.

FIG. 6A shows a principle of generation of a di/dt noise caused by induced electromotive forces. When a magnetic field (a magnetic flux density B) is applied to two wiring lines constituting a Wheatstone bridge circuit (that is, a closed loop) of a magnetic sensor 50, and magnetic fluxes ($\phi$=BS, where S is an area between the wiring lines) pass between the two wiring lines, the induced electromotive forces ($V=-d\phi/dt=-SdB/dt$) are generated in the two wiring lines such that an increase and decrease in a magnetic flux density (magnetic field intensity B/$\mu$, where $\mu$ is magnetic permeability) is canceled out. When the wiring lines are parallel, leftward induced electromotive forces (indicated by open arrows in the figure) applied to an upper wiring line and rightward induced electromotive forces (indicated by filled arrows in the figure) applied to a lower wiring line by respective magnetic fluxes penetrating between the wiring lines are added together, to generate a great induced electromotive force between the two wiring lines. As a result, a noise, the so-called di/dt noise, caused by the induced electromotive forces is superimposed on an output signal of the magnetic sensor.

Figure 6B:
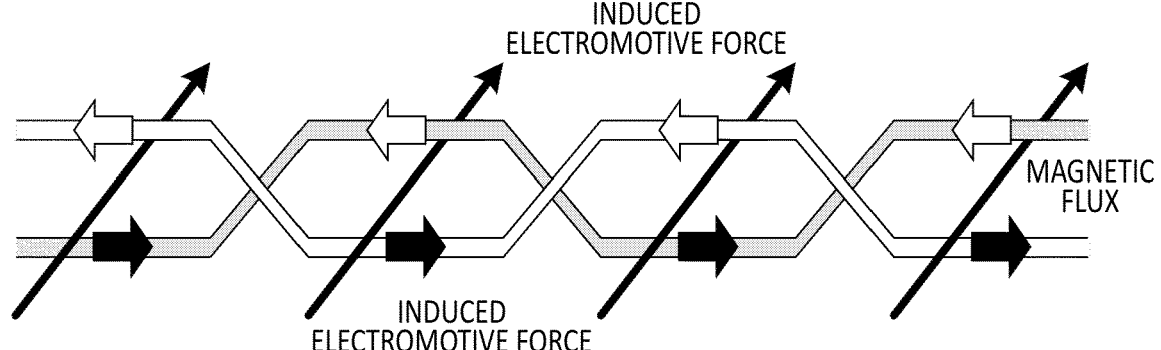
FIG. 6B shows a principle of suppressing the di/dt noise by twisting wiring lines.

FIG. 6B shows a principle of suppressing the di/dt noise. A plurality of partial loops with equal areas are formed in the closed loop by twisting the two wiring lines constituting the closed loop to form twisted wires. When the magnetic field (the magnetic flux density B) is applied to the two wiring lines, and a magnetic flux passes through each of the plurality of partial loops, induced electromotive forces are generated in the wiring lines constituting each of the partial loops such that the increase and decrease in the magnetic flux density is canceled out. When the wiring lines are twisted, in each of the partial loops, a leftward induced electromotive force (indicated by an open arrow in the figure) is applied to the upper wiring line, and a rightward induced electromotive force (indicated by a filled arrow in the figure) is applied to the lower wiring line. However, in each of the two wiring lines, a direction of the induced electromotive force is changed for each of parts constituting the partial loops, so that an induced electromotive force applied to the entire wiring line is suppressed. It should be noted that directions of the induced electromotive forces generated in each of the loops are also referred to as polarities. Especially, when an even number of partial loops are formed, the induced electromotive force applied to the entire wiring line is canceled out. In this manner, providing the even number of partial loops with equal loop areas and opposite polarities in the Wheatstone bridge circuit of the magnetic sensor 50 can cancel out or strongly suppress the di/dt noise.

Figure 7:
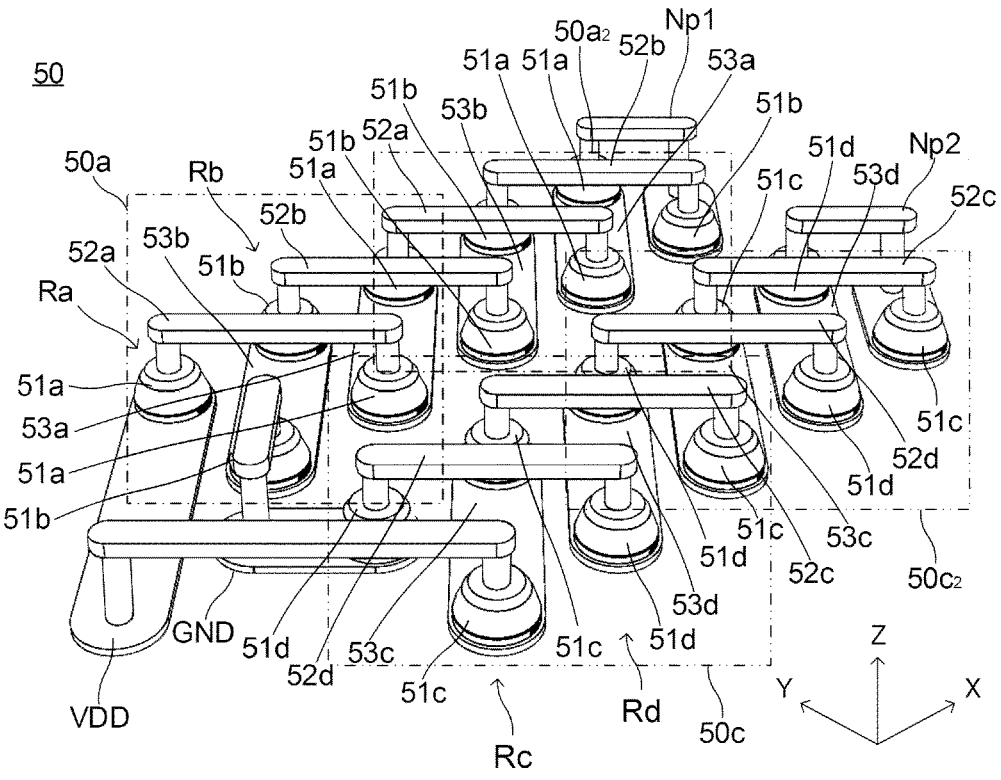
FIG. 7 shows a configuration of a magnetic sensor according to the first embodiment in a perspective view.

FIG. 7 shows a configuration of a magnetic sensor 50 according to the first embodiment in a perspective view. The magnetic sensor 50 includes four resistor arms Ra to Rd assembled into a twisted Wheatstone bridge circuit. It should be noted that the magneto resistive elements 51a to 51d respectively included in the resistor arms Ra to Rd are configured as described above.

The resistor arm Ra has a plurality of magneto resistive elements 51a, a plurality of electrode pieces 52a, and a plurality of electrode pieces 53a. The plurality of magneto resistive elements 51a are arrayed on one surface such as an upper surface of the conductor 24, for example. Each of the plurality of electrode pieces 52a is a narrow piece-like member formed of a conductive metal, and connects respective upper surfaces of two elements that are adjacent to each other and that are of the plurality of magneto resistive elements 51a (that is, upper surfaces of cap layers 51r). Each of the plurality of electrode pieces 53a is a wide piece-like member formed of a conductive metal, and connects respective lower surfaces of two elements that are adjacent to each other and that are of the plurality of magneto resistive elements 51a (that is, lower surfaces of fixed layers 51o), and especially, connects a lower surface of one of two magneto resistive elements 51a whose upper surfaces are connected by an electrode piece 52a to a lower surface of another magneto resistive element 51a of the plurality of magneto resistive elements 51a.

The plurality of magneto resistive elements 51a are alternately connected in array sequence by electrode pieces 52a and electrode pieces 53a. In other words, an upper surface of a first magneto resistive element 51a is connected to an upper surface of a second magneto resistive element 51a by the electrode piece 52a, a lower surface of the second magneto resistive element 51a is connected to a lower surface of a third magneto resistive element 51a by the electrode piece 53a, an upper surface of the third magneto resistive element 51a is connected to an upper surface of a fourth magneto resistive element 51a by the electrode piece 52a, and a lower surface of the fourth magneto resistive element 51a is connected to a lower surface of a fifth magneto resistive element 51a by the electrode piece 53a, so that the plurality of (in the present example, five) magneto resistive elements 51a are linked in series.

The resistor arm Rb has a plurality of magneto resistive elements 51b, a plurality of electrode pieces 52b, and a plurality of electrode pieces 53b. The plurality of magneto resistive elements 51b are arrayed on one surface such as the upper surface of the conductor 24. Each of the plurality of electrode pieces 52b and the plurality of electrode pieces 53b is formed similarly to the plurality of electrode pieces 52a and the plurality of electrode pieces 53a, and connects upper surfaces or lower surfaces of two elements that are adjacent to each other and that are of the plurality of magneto resistive elements 51b. Here, each of the plurality of electrode pieces 53b connects a lower surface of one of two magneto resistive elements 51b whose upper surfaces are connected by an electrode piece 52b to a lower surface of another magneto resistive element 51b of the plurality of magneto resistive elements 51b.

The plurality of magneto resistive elements 51b are alternately connected in array sequence by electrode pieces 52b and electrode pieces 53b. In other words, a lower surface of a first magneto resistive element 51b is connected to a lower surface of a second magneto resistive element 51b by the electrode piece 53b, an upper surface of the second magneto resistive element 51b is connected to an upper surface of a third magneto resistive element 51b by the electrode piece 52b, a lower surface of the third magneto resistive element 51b is connected to a lower surface of a fourth magneto resistive element 51b by the electrode piece 53b, and an upper surface of the fourth magneto resistive element 51b is connected to an upper surface of a fifth magneto resistive element 51b by the electrode piece 52b, so that the plurality of (in the present example, five) magneto resistive elements 51b are linked in series.

Here, the resistor arm Ra and the resistor arm Rb include an intersecting part 50a where their respective electrode pieces intersect three-dimensionally. In the intersecting part 50a, the electrode piece 52a and the electrode piece 52b are arranged to be parallel to each other with their longitudinal sides being oriented in the rightward/leftward direction in the drawing, and the electrode piece 53a and the electrode piece 53b are arranged to be parallel to each other with their longitudinal sides being oriented in the upward/downward direction in the drawing. That is, the electrode piece 52a and the electrode piece 52b are arranged in a direction in which the electrode piece 52a and the electrode piece 52b intersect with the electrode piece 53a and the electrode piece 53b. Here, an angle at which the electrode piece 52a and the electrode piece 52b intersect with the electrode piece 53a and the electrode piece 53b may be 90 degrees. Furthermore, the electrode piece 52a is arranged to be upwardly/downwardly spaced apart from and intersect with the electrode piece 53b, and the electrode piece 53a is arranged to be upwardly/downwardly spaced apart from and intersect with the electrode piece 52b. As a result, the resistor arm Ra and the resistor arm Rb can be assembled on one surface in a twisted pattern and disposed in a limited region.

Furthermore, a length of the electrode piece 52a and a length of the electrode piece 52b are equal to each other, and a length of the electrode piece 53a and a length of the electrode piece 53b are equal to each other. Here, the lengths of the electrode pieces 52a and 53a are defined as lengths in directions in which two magneto resistive elements 51a that are adjacent to each other are connected. In addition, the lengths of the electrode pieces 52b and 53b are defined as lengths in directions in which two magneto resistive elements 51b that are adjacent to each other are connected. As a result, when the intersecting part 50a is viewed from the X axis direction, the Y axis direction, or any direction in the XY plane, a pair of partial loops with equal loop areas and opposite polarities are formed.

It should be noted that the resistor arm Ra and the resistor arm Rb may include a plurality of sets of intersecting parts 50a that are coupled to each other. In the present example, an intersecting part $50a_2$ is coupled to the intersecting part 50a described above, similarly to which the intersecting part $50a_2$ is configured. As a result, the resistor arm Ra has an even number of electrode pieces 52a and electrode pieces 53a (in the present example, two for each), the resistor arm Rb has an even number of electrode pieces 52b and electrode pieces 53b (in the present example, two for each).

Here, the intersecting part 50a includes a partial loop formed of four electrode pieces 52a, 53a, 52b, and 53b when viewed in the Z axis direction, and is further coupled to the intersecting part $50a_2$, so that a second partial loop is formed of four electrode pieces 52a, 53a, 52b, and 53b between the intersecting parts 50a and $50a_2$. In other words, coupling a plurality of intersecting parts 50a forms one or more pairs of partial loops with equal loop areas and opposite polarities when viewed in the Z axis direction.

The resistor arm Rc has a plurality of magneto resistive elements 51c, a plurality of electrode pieces 52c, and a plurality of electrode pieces 53c. The plurality of magneto resistive elements 51$c$ are arrayed on one surface such as the upper surface of the conductor 24. Each of the plurality of electrode pieces 52$c$ is a narrow piece-like member formed of a conductive metal, and connects respective upper surfaces of two elements that are adjacent to each other and that are of the plurality of magneto resistive elements 51$c$ (that is, upper surfaces of cap layers 51$r$). Each of the plurality of electrode pieces 53$c$ is a wide piece-like member formed of a conductive metal, and connects respective lower surfaces of two elements that are adjacent to each other and that are of the plurality of magneto resistive elements 51$c$ (that is, lower surfaces of fixed layers 51$o$), and especially, connects a lower surface of one of the two magneto resistive elements 51$c$ whose upper surfaces are connected by an electrode piece 52$c$ to a lower surface of another magneto resistive element 51$c$ of the plurality of magneto resistive elements 51$c$.

The plurality of magneto resistive elements 51$c$ are alternately connected in array sequence by electrode pieces 52$c$ and electrode pieces 53$c$. Connection between the plurality of magneto resistive elements 51$c$ by the electrode pieces 52$c$ and the electrode pieces 53$c$ is similar to connection between the plurality of magneto resistive elements 51$b$ by the electrode pieces 52$b$ and the electrode pieces 53$b$. As a result, the plurality of (in the present example, five) magneto resistive elements 51$c$ are linked in series.

The resistor arm Rd has a plurality of magneto resistive elements 51$d$, a plurality of electrode pieces 52$d$, and a plurality of electrode pieces 53$d$. The plurality of magneto resistive elements 51$d$ are arrayed on one surface such as the upper surface of the conductor 24. Each of the plurality of electrode pieces 52$d$ and the plurality of electrode pieces 53$d$ is formed similarly to the plurality of electrode pieces 52$c$ and the plurality of electrode pieces 53$c$, and connects upper surfaces or lower surfaces of two elements that are adjacent to each other and that are of the plurality of magneto resistive elements 51$d$. Here, each of the plurality of electrode pieces 53$d$ connects a lower surface of one of the two magneto resistive elements 51$d$ whose upper surfaces are connected by the electrode piece 52$d$ to a lower surface of another magneto resistive element 51$d$ of the plurality of magneto resistive elements 51$d$.

The plurality of magneto resistive elements 51$d$ are alternately connected in array sequence by electrode pieces 52$d$ and electrode pieces 53$d$. Connection between the plurality of magneto resistive elements 51$d$ by the electrode pieces 52$d$ and the electrode pieces 53$d$ is similar to connection between the plurality of magneto resistive elements 51$a$ by the electrode pieces 52$a$ and the electrode pieces 53$a$. As a result, the plurality of (in the present example, five) magneto resistive elements 51$d$ are linked in series.

Here, the resistor arm Rc and the resistor arm Rd include an intersecting part 50$c$ where their respective electrode pieces intersect three-dimensionally. In the intersecting part 50$c$, the electrode piece 52$c$ and the electrode piece 52$d$ are arranged to be parallel to each other with their longitudinal sides being oriented in the rightward/leftward direction in the drawing, and the electrode piece 53$c$ and the electrode piece 53$d$ are arranged to be parallel to each other with their longitudinal sides being oriented in the upward/downward direction in the drawing. That is, the electrode piece 52$c$ and the electrode piece 52$d$ are arranged in a direction in which the electrode piece 52$c$ and the electrode piece 52$d$ intersect with the electrode piece 53$c$ and the electrode piece 53$d$. Here, an angle at which the electrode piece 52$c$ and the electrode piece 52$d$ intersect with the electrode piece 53$c$ and the electrode piece 53$d$ may be 90 degrees. Furthermore, the electrode piece 52$c$ is arranged to be upwardly/downwardly spaced apart from and intersect with the electrode piece 53$d$, and the electrode piece 53$c$ is arranged to be upwardly/downwardly spaced apart from and intersect with the electrode piece 52$d$. As a result, the resistor arm Rc and the resistor arm Rd can be assembled on one surface in a twisted pattern and disposed in a limited region.

Furthermore, a length of the electrode piece 52$c$ and a length of the electrode piece 52$d$ are equal to each other, and a length of the electrode piece 53$c$ and a length of the electrode piece 53$d$ are equal to each other. Here, the lengths of the electrode pieces 52$c$ and 53$c$ are defined as lengths in directions in which two magneto resistive elements 51$c$ that are adjacent to each other are connected. In addition, the lengths of the electrode pieces 52$d$ and 53$d$ are defined as lengths in directions in which two magneto resistive elements 51$d$ that are adjacent to each other are connected. As a result, when the intersecting part 50$c$ is viewed from the X axis direction, the Y axis direction, or any direction in the XY plane, a pair of partial loops with equal loop areas and opposite polarities are formed.

It should be noted that the resistor arm Rc and the resistor arm Rd may include a plurality of sets of intersecting parts 50$c$ that are coupled to each other. In the present example, an intersecting part 50$c_2$ is coupled to the intersecting part 50$c$ described above, similarly to which the intersecting part 50$c_2$ is configured. As a result, the resistor arm Rc has an even number of electrode pieces 52$c$ and electrode pieces 53$c$ (in the present example, two for each), the resistor arm Rb has an even number of electrode pieces 52$d$ and electrode pieces 53$d$ (in the present example, two for each).

Here, the intersecting part 50$c$ includes a partial loop formed of four electrode pieces 52$c$, 53$c$, 52$d$, and 53$d$ when viewed in the Z axis direction, and is further coupled to the intersecting part 50$c_2$, so that a second partial loop is formed of four electrode pieces 52$c$, 53$c$, 52$d$, and 53$d$ between the intersecting parts 50$c$ and 50$c_2$. In other words, coupling a plurality of intersecting parts 50$c$ forms one or more pairs of partial loops with equal loop areas and opposite polarities when viewed in the Z axis direction.

Figure 8A:
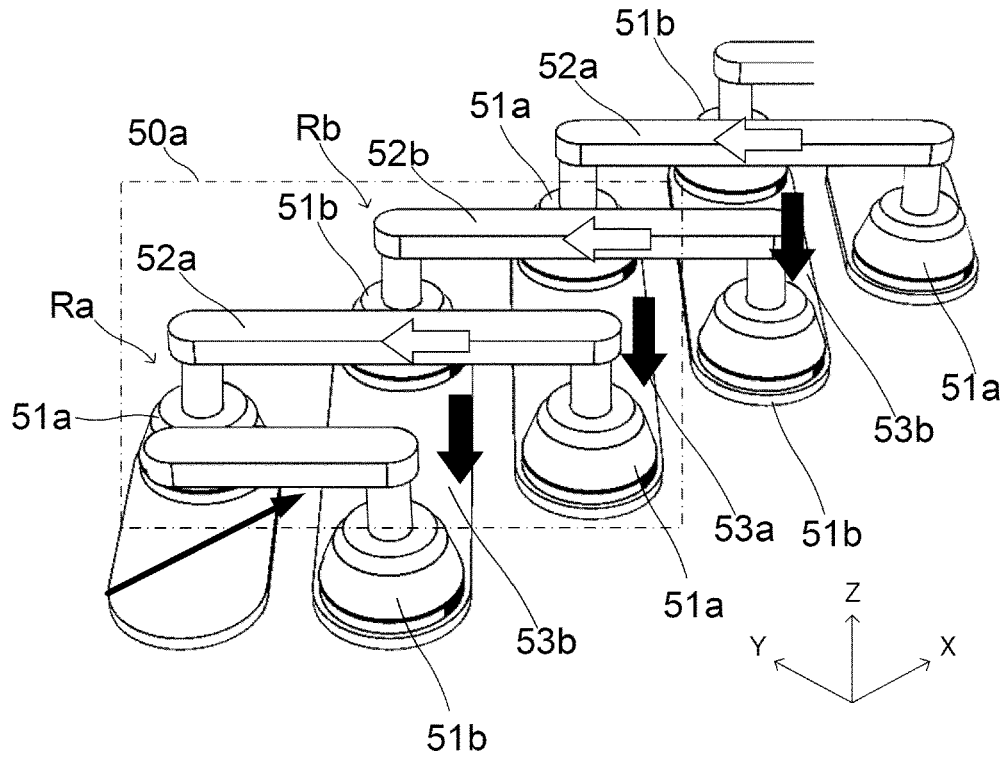
FIG. 8A shows a principle of suppressing a di/dt noise caused by application of an X direction magnetic field.

FIG. 8A shows a principle of suppressing a di/dt noise caused by application of an X direction magnetic field. As one example, when a magnetic flux (solid arrow) oriented in the +X direction is applied to resistor arms Ra and Rb, induced electromotive forces directed leftward (open arrow) and downward (filled arrow) in the drawing are respectively generated in the electrode pieces 52$a$ and 53$b$ which form a partial loop when viewed in the X direction, induced electromotive forces directed leftward (open arrow) and downward (filled arrow) in the drawing are respectively generated in the electrode pieces 52$b$ and 53$a$ which form an adjacent partial loop, and induced electromotive forces directed leftward (open arrow) and downward (filled arrow) in the drawing are respectively generated in the electrode pieces 52$a$ and 53$b$ which form a further adjacent partial loop. Here, the lengths of the electrode pieces 52$a$, 52$b$, 53$a$, and 53$b$ (especially, lengths of parts which form the partial loops) are equal, and the electrode pieces 52$a$ and 52$b$ and the electrode pieces 53$a$ and 53$b$ are connected via an output terminal Np1, so that the induced electromotive forces generated in the electrode piece 52$a$ and the electrode piece 53$b$ are canceled out, and the induced electromotive forces generated in the electrode piece 52$b$ and the electrode piece 53$a$ are canceled out.

It should be noted that, also when the X direction magnetic field is applied to resistor arms Rc and Rd, induced electromotive forces generated in electrode pieces constituting the resistor arms Rc and Rd are canceled out based on a similar principle.

Figure 8B:
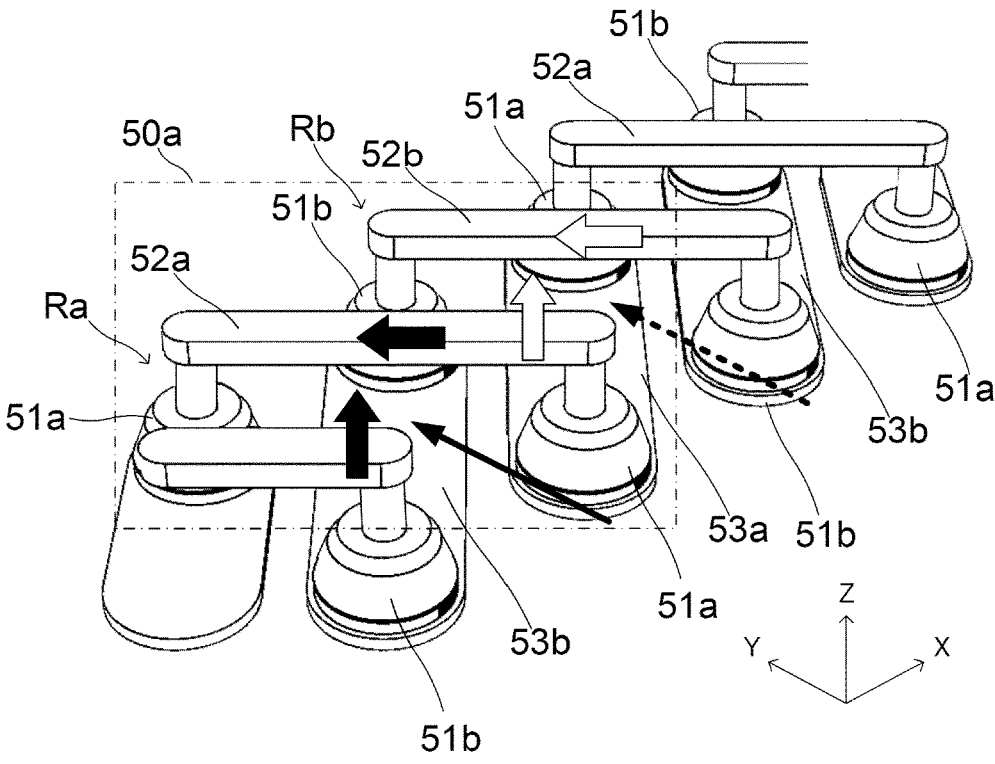
FIG. 8B shows a principle of suppressing a di/dt noise caused by application of a Y direction magnetic field.

FIG. 8B shows a principle of suppressing a di/dt noise caused by application of a Y direction magnetic field. As one example, when magnetic fluxes (solid arrow and dotted arrow) oriented in the +Y direction are applied to the resistor arms Ra and Rb, induced electromotive forces directed leftward (filled arrow) in the drawing and upward (filled arrow) in the drawing are respectively generated in the electrode pieces 52a and 53b which form a partial loop when viewed in the Y direction, and induced electromotive forces directed leftward (open arrow) in the drawing and upward (open arrow) in the drawing are respectively generated in the electrode pieces 52b and 53a which form an adjacent partial loop. Here, the lengths of the electrode pieces 52a, 52b, 53a, and 53b (especially, lengths of parts which form the partial loops) are equal, so that two partial loops have equal loop areas, and the electrode pieces 52a, 52b, 53a, and 53b are connected in a twisted pattern, so that the two partial loops have opposite polarities. As a result, the induced electromotive force (filled arrow) generated in the electrode piece 52a by the magnetic flux (solid arrow) and the induced electromotive force (open arrow) generated in the electrode piece 53a by the magnetic flux (dotted arrow) are canceled out, and the induced electromotive force (filled arrow) generated in in the electrode piece 53b by the magnetic flux (solid arrow) and the induced electromotive force (open arrow) generated in the electrode piece 52b by the magnetic flux (dotted arrow) are canceled out.

It should be noted that the resistor arms Ra and Rb include a plurality of electrode pieces 52a, 52b, 53a, and 53b, so that a plurality of pairs of partial loops having opposite polarities are formed. As a result, the induced electromotive forces applied to the entire resistor arms Ra and Rb are canceled out. In addition, also when the Y direction magnetic field is applied to the resistor arms Rc and Rd, induced electromotive forces generated in electrode pieces constituting the resistor arms Rc and Rd are canceled out based on a similar principle.

Figure 8C:
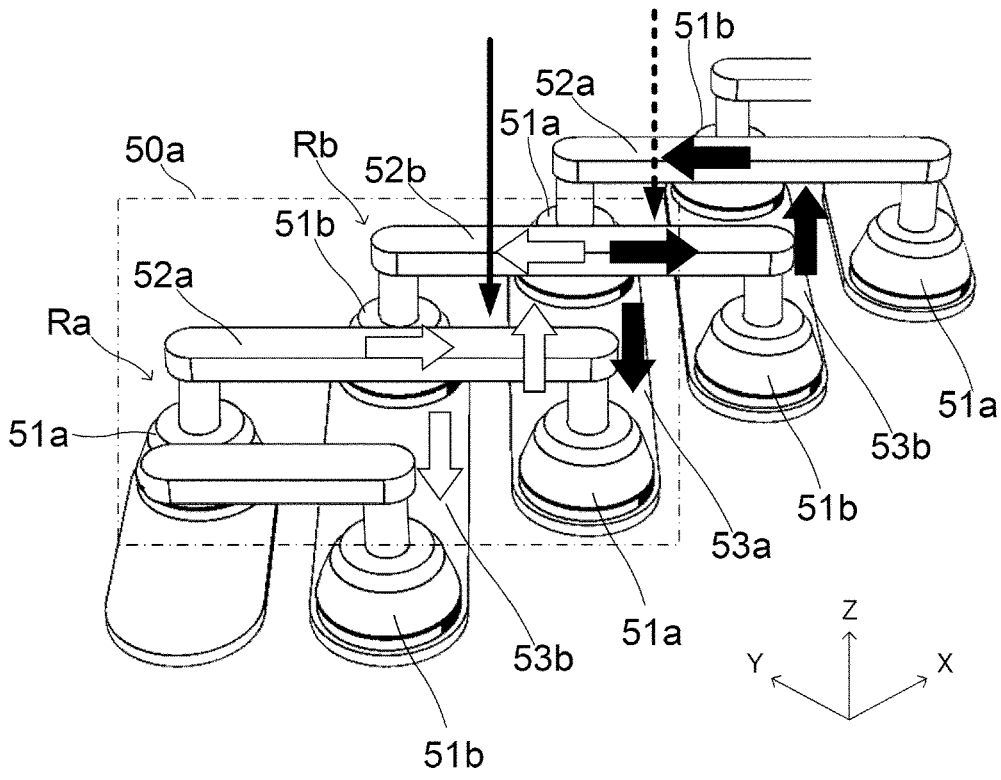
FIG. 8C shows a principle of suppressing a di/dt noise caused by application of a Z direction magnetic field.

FIG. 8C shows a principle of suppressing a di/dt noise caused by application of a Z direction magnetic field. As one example, when magnetic fluxes (solid arrow and dotted arrow) oriented in the −Z direction are applied to the resistor arms Ra and Rb, induced electromotive forces directed rightward (open arrow), upward (open arrow), leftward (open arrow), and downward (open arrow) in the drawing are respectively generated in the electrode pieces 52a, 53a, 52b, and 53b which form a partial loop when viewed in the Z direction, and induced electromotive forces directed rightward (filled arrow), upward (filled arrow), leftward (filled arrow), and downward (filled arrow) in the drawing are respectively generated in the electrode pieces 52b, 53b, 52a, and 53a which form an adjacent partial loop. Here, the lengths of the electrode pieces 52a, 52b, 53a, and 53b (especially, lengths of parts which form the partial loops) are equal, and the electrode pieces 52a, 52b, 53a, and 53b are connected in a twisted pattern, so that two partial loops have opposite polarities. As a result, the induced electromotive force (open arrow) generated in the electrode piece 52b by the magnetic flux (solid arrow) and the induced electromotive force (filled arrow) generated in the electrode piece 52b by the magnetic flux (dotted arrow) are canceled out, and the induced electromotive force (open arrow) generated in in the electrode piece 53a by the magnetic flux (solid arrow) and the induced electromotive force (filled arrow) generated in the electrode piece 53a by the magnetic flux (dotted arrow) are also canceled out.

It should be noted that, in other electrode pieces as well, induced electromotive forces generated by magnetic fluxes respectively applied to two adjacent partial loops are canceled out based on a similar principle. As a result, the induced electromotive forces applied to the entire resistor arms Ra and Rb are canceled out. In addition, also when the Z direction magnetic field is applied to the resistor arms Rc and Rd, induced electromotive forces generated in electrode pieces constituting the resistor arms Rc and Rd are canceled out based on a similar principle.

As described above, the resistor arms Ra to Rd are connected in a Wheatstone bridge circuit pattern. One end of the resistor arm Ra (the end at the top right of the drawing) is connected to one end of the resistor arm Rb (the end at the top right of the drawing) to form the output terminal Np1, one end of the resistor arm Rc (the end at the top right of the drawing) is connected to one end of the resistor arm Rd (the end at the top right of the drawing) to form an output terminal Np2, another end of the resistor arm Ra (the end at the bottom left of the drawing) is connected to another end of the resistor arm Rc (the end at the bottom left of the drawing) to form a power source terminal VDD, and another end of the resistor arm Rb (the end at the bottom left of the drawing) is connected to another end of the resistor arm Rd (the end at the bottom left of the drawing) to form a ground terminal GND. Here, magnetic field detection directions of a magneto resistive element 51a and a magneto resistive element 51d are the same, magnetic field detection directions of a magneto resistive element 51b and a magneto resistive element 51c are the same, and the magnetic field detection directions of the magneto resistive element 51a and the magneto resistive element 51d are opposite to the magnetic field detection directions of the magneto resistive element 51b and the magneto resistive element 51c.

When a magnetic field is applied to the magneto resistive elements 51a to 51d included in the resistor arms Ra to Rd of the magnetic sensor 50, for example, when a magnetic field is applied in the same direction as the magnetic field detection directions of the magneto resistive element 51a and the magneto resistive element 51d (a direction opposite to the magnetic field detection directions of the magneto resistive element 51b and the magneto resistive element 51c), resistance values of the resistor arm Ra and the resistor arm Rd respectively including the magneto resistive element 51a and the magneto resistive element 51d decrease, and resistance values of the resistor arm Rb and the resistor arm Rc respectively including the magneto resistive element 51b and the magneto resistive element 51c increase, so that resistance balance between the resistor arms Ra to Rd is disrupted. Therefore, a magnetic field intensity can be detected by inputting a drive voltage to the power source terminal VDD with respect to the ground terminal GND and detecting a differential voltage outputted from between the output terminals Np1 and Np2.

The magnetic sensor 50 according to the first embodiment includes: a first resistor arm Ra having: a plurality of first magneto resistive elements 51a which are arrayed on one surface; a first electrode piece 52a which connects respective upper surfaces of two elements that are adjacent to each other and that are of the plurality of first magneto resistive elements 51a; and a second electrode piece 53a which connects respective lower surfaces of two elements that are adjacent to each other and that are of the plurality of first magneto resistive elements 51a, where the plurality of first magneto resistive elements 51*a* are alternately connected in array sequence by the first electrode piece 52*a* and the second electrode piece 53*a*; and a second resistor arm Rb having: a plurality of second magneto resistive elements 51*b* which are arrayed on the one surface; a third electrode piece 52*b* which connects respective upper surfaces of two elements that are adjacent to each other and that are of the plurality of second magneto resistive elements 51*b*; and a fourth electrode piece 53*b* which connects respective lower surfaces of two elements that are adjacent to each other and that are of the plurality of second magneto resistive elements 51*b*, where the plurality of second magneto resistive elements 51*b* are alternately connected in array sequence by the third electrode piece 52*b* and the fourth electrode piece 53*b*, where the magnetic sensor 50 includes an intersecting part 50*a* in which the first electrode piece 52*a* is arranged to be upwardly/downwardly spaced apart from and intersect with the fourth electrode piece 53*b* and the second electrode piece 53*a* is arranged to be upwardly/downwardly spaced apart from and intersect with the third electrode piece 52*b*.

According to this, the first resistor arm Ra having the first magneto resistive elements 51*a* which are arrayed on one surface and the second resistor arm Rb having the second magneto resistive elements 51*b* which are arrayed on the same one surface are assembled in a twisted pattern, with the first electrode piece 52*a* which connects upper surfaces of two first magneto resistive elements 51*a* being upwardly/downwardly spaced apart from and intersect with the fourth electrode piece 53*b* which connects lower surfaces of two second magneto resistive elements 51*b*, and with the second electrode piece 53*a* which connects lower surfaces of two first magneto resistive elements 51*a* being upwardly/downwardly spaced apart from and intersect with the third electrode piece 52*b* which connects upper surfaces of two second magneto resistive elements 51*b*, so that two partial loops with opposite polarities including a partial loop formed by the first electrode piece 52*a* and the fourth electrode piece 53*b* and a partial loop formed by the second electrode piece 53*a* and the third electrode piece 52*b* are formed when the first resistor arm Ra and the second resistor arm Rb are connected, and it is possible to cancel out the noise caused by the induced electromotive force for a time when the magnetic field is applied. Furthermore, assembling the first resistor arm Ra and the second resistor arm Rb in a twisted pattern can decrease a unit area in which arrangement can be made, thereby reducing an influence of a gradient of the magnetic field intensity, so that a common-mode voltage can be suppressed.

The current detection device 100 according to the first embodiment includes: a conductor 24 through which a to-be-measured current flows; and the magnetic sensor 50 which is arranged on the conductor 24 or near the conductor 24. As a result, it is possible to suppress the di/dt noise caused by the induced electromotive force and the common-mode noise caused by the gradient of the magnetic field intensity.

It should be noted that, in the magnetic sensor 50 according to the first embodiment, the resistor arms Ra and Rb are assembled in a twisted pattern and the resistor arms Rc and Rd are assembled in a twisted pattern, but alternatively, the resistor arms Ra and Rc may be assembled in a twisted pattern and the resistor arms Rb and Rd may be assembled in a twisted pattern, or the resistor arms Ra and Rd may be assembled in a twisted pattern and the resistor arms Rb and Rc may be assembled in a twisted pattern.

Second Embodiment

A current detection device according to a second embodiment is a sensor which measures an amount of current by using a magnetic sensor 59 to detect a magnetic field generated around a conductor 24 as a result of a to-be-measured current flowing through the conductor 24, and can suppress especially a di/dt noise due to an induced electromotive force and/or a differential amplification noise caused by spread of a magnetic field distribution. The current detection device can be configured similarly to the current detection device 100 according to the first embodiment by using the magnetic sensor 59 instead of a magnetic sensor 50.

Figure 9:
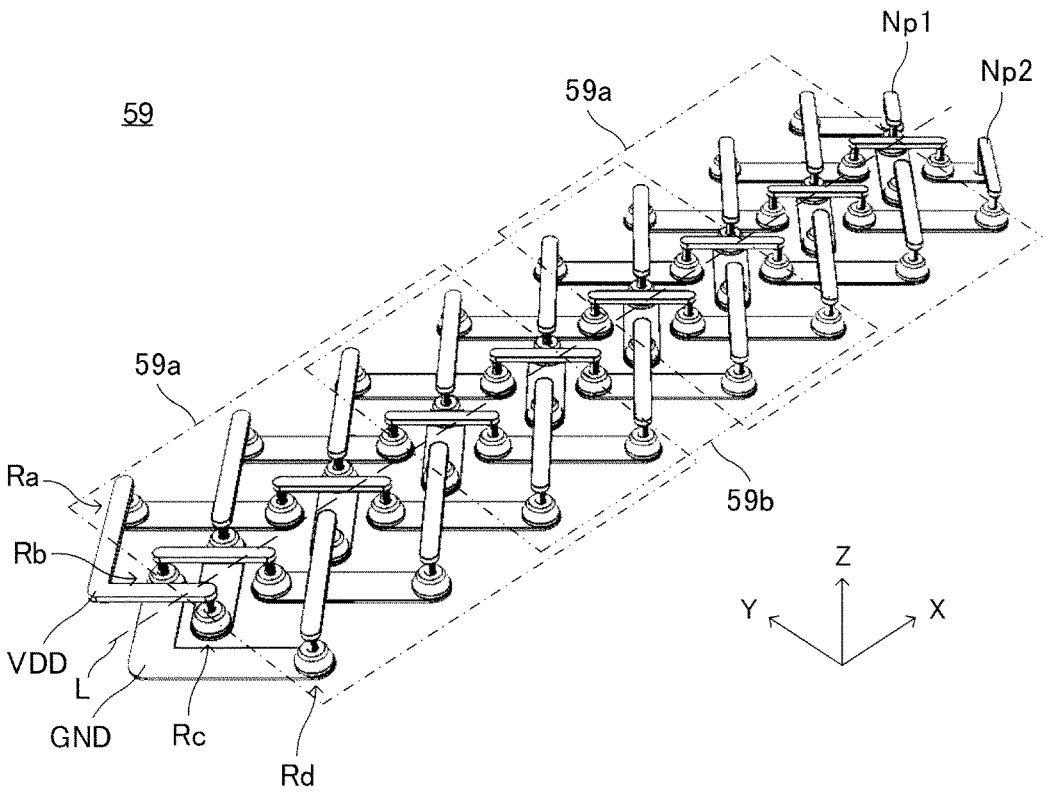
FIG. 9 shows a configuration of a magnetic sensor according to a second embodiment in a perspective view.

FIG. 9 shows a configuration of the magnetic sensor 59 according to the second embodiment in a perspective view. The magnetic sensor 59 includes four resistor arms Ra to Rd assembled into a four-braid Wheatstone bridge circuit. Here, the four resistor arms Ra to Rd include unitary units 59*a* and 59*b* which partially constitute them, and these unitary units 59*a* and 59*b* can be alternately coupled to be extended in the X axis direction, or can be extended in the X axis direction and then folded back to be further extended. In the present example, they include two unitary units 59*a* and one unitary unit 59*b* coupled therebetween. It should be noted that magneto resistive elements 51*a* to 51*d* respectively included in the resistor arms Ra to Rd are configured as described above.

The resistor arm Ra has a plurality of magneto resistive elements 51*a* and electrode pieces 52*a*, 53*a*, 54*a*, and 55*a*. The plurality of magneto resistive elements 51*a* are arrayed on one surface such as an upper surface of the conductor 24, for example. Each of the electrode pieces 52*a* and 54*a* is a narrow piece-like member formed of a conductive metal, and connects respective upper surfaces of two elements that are adjacent to each other and that are of the plurality of magneto resistive elements 51*a* (that is, upper surfaces of cap layers 51*r*). Each of the electrode pieces 53*a* and 55*a* is a wide piece-like member formed of a conductive metal, and connects respective lower surfaces of two elements that are adjacent to each other and that are of the plurality of magneto resistive elements 51*a* (that is, lower surfaces of fixed layers 51*o*), and especially, they connects a lower surface of one of two magneto resistive elements 51*a* whose upper surfaces are connected by electrode pieces 52*a* and 54*a* to a lower surface of another magneto resistive element 51*a* of the plurality of magneto resistive elements 51*a*.

Figure 10A:
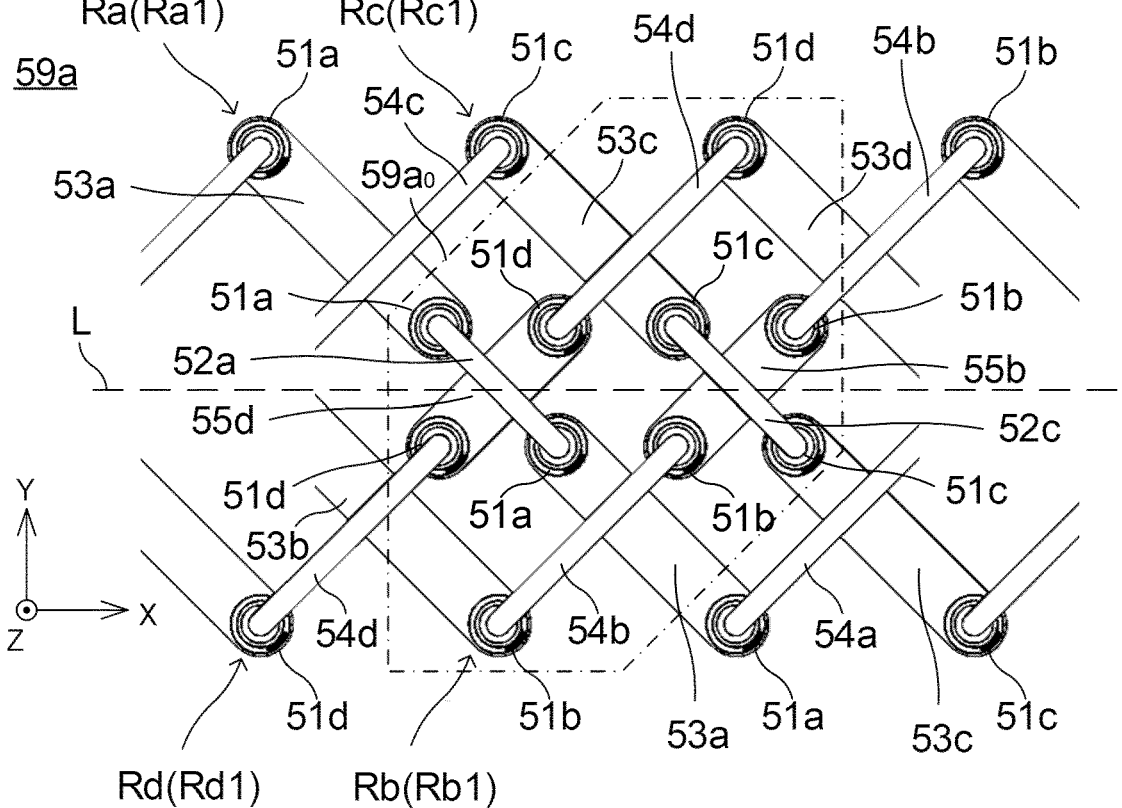
FIG. 10A shows a configuration of a unitary unit of the magnetic sensor according to the second embodiment in a top view.
Figure 10B:
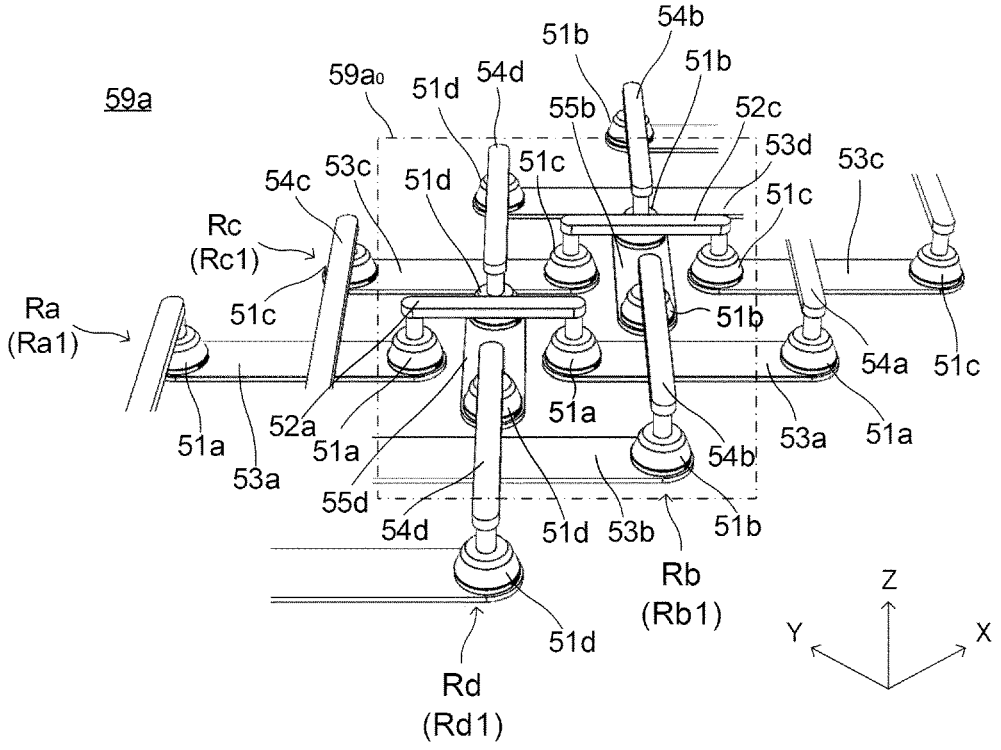
FIG. 10B shows the configuration of the unitary unit of the magnetic sensor according to the second embodiment in a perspective view.

FIG. 10A and FIG. 10B respectively show a configuration of a unitary unit 59*a* of the magnetic sensor 59 in a top view and a perspective view. In the unitary unit 59*a*, a plurality of magneto resistive elements 51*a* are alternately connected in array sequence by electrode pieces 52*a* and 53*a*. In other words, a lower surface of a first magneto resistive element 51*a* (a first element from the left of the top row in FIG. 10A) is connected to a lower surface of a second magneto resistive element 51*a* by an electrode piece 53*a*, an upper surface of the second magneto resistive element 51*a* is connected to an upper surface of a third magneto resistive element 51*a* by an electrode piece 52*a*, and a lower surface of the third magneto resistive element 51*a* is connected to a lower surface of a fourth magneto resistive element 51*a* (a second element from the right of the bottom row in FIG. 10A) by an electrode piece 53*a*, so that four magneto resistive elements 51*a* are linked in series.

Figure 11A:
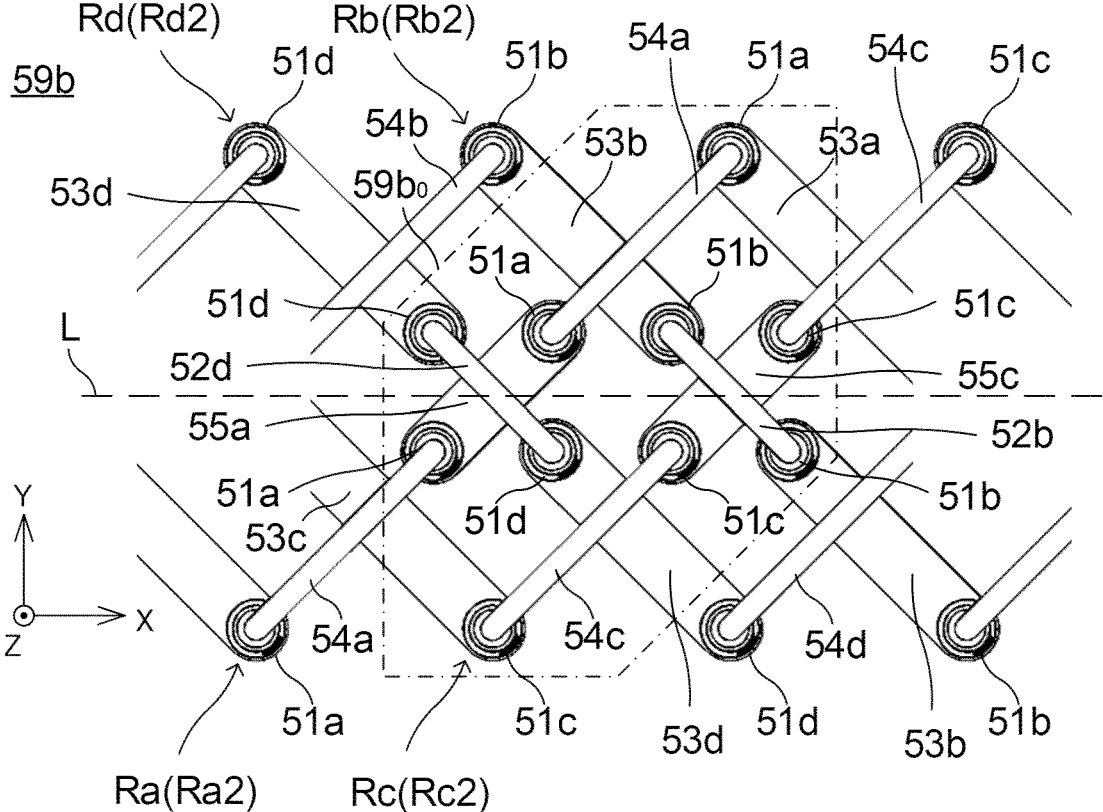
FIG. 11A shows a configuration of another unitary unit of the magnetic sensor according to the second embodiment in a top view.
Figure 11B:
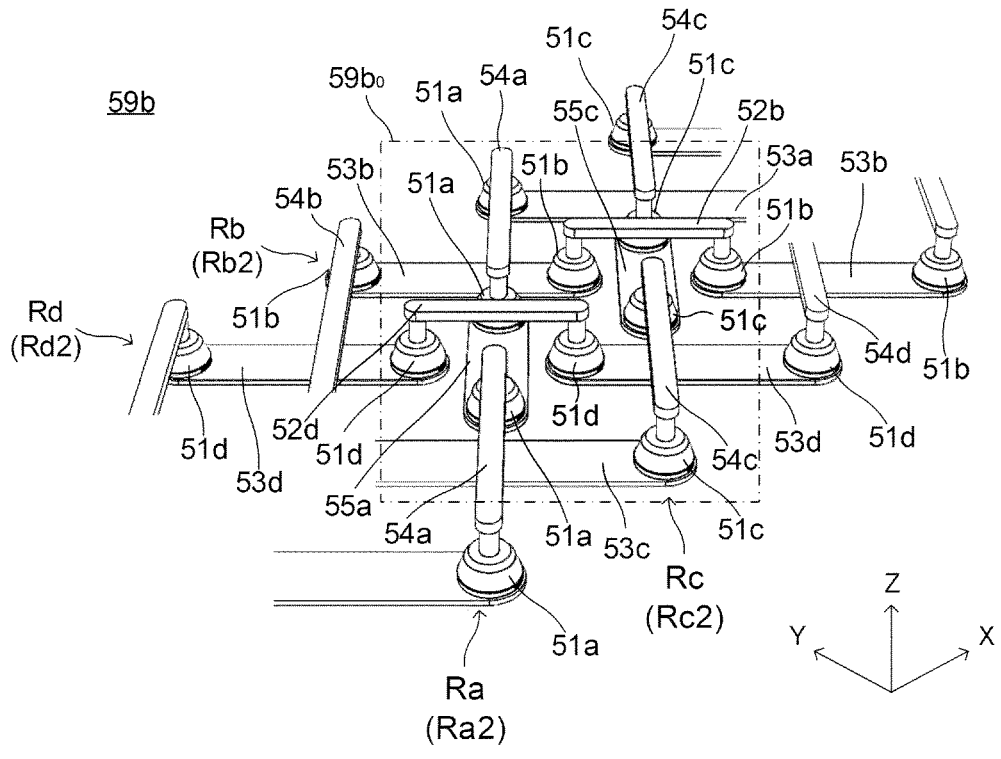
FIG. 11B shows the configuration of another unitary unit of the magnetic sensor according to the second embodiment in a perspective view.

FIG. 11A and FIG. 11B respectively show a configuration of a unitary unit 59*b* of the magnetic sensor 59 in a top view and a perspective view. In the unitary unit 59*b*, a plurality of magneto resistive elements 51*a* are alternately connected in array sequence by electrode pieces 54*a* and 55*a*. In other words, an upper surface of a first magneto resistive element 51*a* (a first element from the left of the bottom row in FIG.

11A) is connected to an upper surface of a second magneto resistive element 51a by an electrode piece 54a, a lower surface of the second magneto resistive element 51a is connected to a lower surface of a third magneto resistive element 51a by an electrode piece 55a, and an upper surface of the third magneto resistive element 51a is connected to an upper surface of a fourth magneto resistive element 51a (a second element from the right of the top row in FIG. 11A) by an electrode piece 54a, so that four magneto resistive elements 51a are linked in series.

A resistor arm Rb has a plurality of magneto resistive elements 51b and electrode pieces 52b, 53b, 54b, and 55b. The plurality of magneto resistive elements 51b are arrayed on one surface such as an upper surface of the conductor 24. Each of the electrode pieces 52b and 54b is formed similarly to electrode pieces 52a and 54a, and connects upper surfaces of two elements that are adjacent to each other and that are of the plurality of magneto resistive elements 51b. Each of the electrode pieces 53b and 55b is formed similarly to electrode pieces 53a and 55a, and connects lower surfaces of two elements that are adjacent to each other and that are of the plurality of magneto resistive elements 51b. Here, the plurality of electrode pieces 53b and 55b connect a lower surface of one of two magneto resistive elements 51b whose upper surfaces are connected by the electrode pieces 52b and 54b to a lower surface of another magneto resistive element 51b of the plurality of magneto resistive elements 51b.

In the unitary unit 59a (see FIG. 10A and FIG. 10B), the plurality of magneto resistive elements 51b are alternately connected in array sequence by the electrode pieces 54b and 55b. In other words, an upper surface of a first magneto resistive element 51b (a second element from the left of the bottom row in FIG. 10A) is connected to an upper surface of a second magneto resistive element 51b by an electrode piece 54b, a lower surface of the second magneto resistive element 51b is connected to a lower surface of a third magneto resistive element 51b by an electrode piece 55b, and an upper surface of the third magneto resistive element 51b is connected to an upper surface of a fourth magneto resistive element 51b (a first element from the right of the top row in FIG. 10A) by an electrode piece 54b, so that four magneto resistive elements 51b are linked in series.

In the unitary unit 59b (see FIG. 11A and FIG. 11B), the plurality of magneto resistive elements 51b are alternately connected in array sequence by the electrode pieces 52b and 53b. In other words, a lower surface of a first magneto resistive element 51b (a second element from the left of the top row in FIG. 11A) is connected to a lower surface of a second magneto resistive element 51b by an electrode piece 53b, an upper surface of the second magneto resistive element 51b is connected to an upper surface of a third magneto resistive element 51b by an electrode piece 52b, and a lower surface of the third magneto resistive element 51b is connected to a lower surface of a fourth magneto resistive element 51b (a first element from the right of the bottom row in FIG. 11A) by the electrode piece 53b, so that four magneto resistive elements 51b are linked in series.

A resistor arm Rc has a plurality of magneto resistive elements 51c and electrode pieces 52c, 53c, 54c, and 55c. The plurality of magneto resistive elements 51c are arrayed on one surface such as the upper surface of the conductor 24. Each of the electrode pieces 52c and 54c is formed similarly to the electrode pieces 52a and 54a, and connects upper surfaces of two elements that are adjacent to each other and that are of the plurality of magneto resistive elements 51c. Each of the electrode pieces 53c and 55c are formed similarly to the electrode pieces 53a and 55a, and connect lower surfaces of two elements that are adjacent to each other and that are of the plurality of magneto resistive elements 51c, and especially, they connect a lower surface of one of two magneto resistive elements 51c whose upper surfaces are connected by the electrode pieces 52c and 54c to a lower surface of another magneto resistive element 51c of the plurality of magneto resistive elements 51c.

In the unitary unit 59a (see FIG. 10A and FIG. 10B), the plurality of magneto resistive elements 51c are alternately connected in array sequence by the electrode pieces 52c and 53c. In other words, a lower surface of a first magneto resistive element 51c (a second element from the left of the top row in FIG. 10A) is connected to a lower surface of a second magneto resistive element 51c by an electrode piece 53c, an upper surface of the second magneto resistive element 51c is connected to an upper surface of a third magneto resistive element 51c by an electrode piece 52c, and a lower surface of the third magneto resistive element 51c is connected to a lower surface of a fourth magneto resistive element 51c (a first element from the right of the bottom row in FIG. 10A) by the electrode piece 53c, so that four magneto resistive elements 51c are linked in series.

In the unitary unit 59b (see FIG. 11A and FIG. 11B), the plurality of magneto resistive elements 51c are alternately connected in array sequence by the electrode pieces 54c and 55c. In other words, an upper surface of a first magneto resistive element 51c (a second element from the left of the bottom row in FIG. 11A) is connected to an upper surface of a second magneto resistive element 51c by an electrode piece 54c, a lower surface of the second magneto resistive element 51c is connected to a lower surface of a third magneto resistive element 51c by an electrode piece 55c, and an upper surface of the third magneto resistive element 51c is connected to an upper surface of a fourth magneto resistive element 51c (a first element from the right of the top row in FIG. 11A) by an electrode piece 54c, so that four magneto resistive elements 51c are linked in series.

A resistor arm Rd has a plurality of magneto resistive elements 51d and electrode pieces 52d, 53d, 54d, and 55d. The plurality of magneto resistive elements 51d are arrayed on one surface such as the upper surface of the conductor 24. Each of the electrode pieces 52d and 54d is formed similarly to the electrode pieces 52a and 54a, and connects upper surfaces of two elements that are adjacent to each other and that are of the plurality of magneto resistive elements 51d. Each of the electrode pieces 53d and 55d is formed similarly to the electrode pieces 53a and 55a, and connects lower surfaces of two elements that are adjacent to each other and that are of the plurality of magneto resistive elements 51d. Here, the plurality of electrode pieces 53d and 55d connect a lower surface of one of the two magneto resistive elements 51d whose upper surfaces are connected by the electrode pieces 52d and 54d to a lower surface of another magneto resistive element 51d of the plurality of magneto resistive elements 51d.

In the unitary unit 59a (see FIG. 10A and FIG. 10B), the plurality of magneto resistive elements 51d are alternately connected in array sequence by the electrode pieces 54d and 55d. In other words, an upper surface of a first magneto resistive element 51d (a first element from the left of the bottom row in FIG. 10A) is connected to an upper surface of a second magneto resistive element 51d by an electrode piece 54d, a lower surface of the second magneto resistive element 51d is connected to a lower surface of a third magneto resistive element 51d by an electrode piece 55d, and an upper surface of the third magneto resistive element 51d is connected to an upper surface of a fourth magneto resistive element 51*d* (a second element from the right of the top row in FIG. 10A) by an electrode piece 54*d*, so that four magneto resistive elements 51*d* are linked in series.

In the unitary unit 59*b* (see FIG. 11A and FIG. 11B), the plurality of magneto resistive elements 51*d* are alternately connected in array sequence by the electrode pieces 52*d* and 53*d*. In other words, a lower surface of a first magneto resistive element 51*d* (a first element from the left of the top row in FIG. 11A) is connected to a lower surface of a second magneto resistive element 51*d* by an electrode piece 53*d*, an upper surface of the second magneto resistive element 51*d* is connected to an upper surface of a third magneto resistive element 51*d* by an electrode piece 52*d*, and a lower surface of the third magneto resistive element 51*d* is connected to a lower surface of a fourth magneto resistive element 51*d* (a second element from the right of the bottom row in FIG. 11A) by an electrode piece 53*d*, so that four magneto resistive elements 51*d* are linked in series.

Here, the unitary unit 59*a* (see FIG. 10A) includes the resistor arms Ra and Rc which extend in parallel with each other toward the bottom right of the drawing and the resistor arms Rb and Rd which extend in parallel with each other toward the top right of the drawing, and includes an intersecting part 59*a*$_0$ where the resistor arms Ra and Rc are arranged in a direction in which the resistor arms Ra and Rc intersect with the resistor arms Rb and Rd and where the resistor arms Ra and Rc alternately intersect with the resistor arms Rb and Rd upwardly/downwardly. An angle at which the resistor arms Ra and Rc intersect with the resistor arms Rb and Rd may be 90 degrees. In the intersecting part 59*a*$_0$, the electrode piece 52*a* is arranged to be upwardly/downwardly spaced apart from and intersect with the electrode piece 55*d*, the electrode piece 53*a* is arranged to be upwardly/downwardly spaced apart from and intersect with the electrode piece 54*b*, the electrode piece 52*c* is arranged to be upwardly/downwardly spaced apart from and intersect with the electrode piece 55*b*, and the electrode piece 53*c* is arranged to be upwardly/downwardly spaced apart from and intersect with the electrode piece 54*d*. As a result, the resistor arms Ra to Rd can be assembled on one surface in a four-braid pattern and disposed in a limited region.

Furthermore, outside the intersecting part 59*a*$_0$, such as a coupling part between the unitary units 59*a* and 59*b* or a coupling part between the unitary units 59*a* and 59*b* and the terminals VDD, GND, NP1, and NP2, the electrode piece 53*a* is arranged to be upwardly/downwardly spaced apart from and intersect with the electrode piece 54*c*, the electrode piece 53*b* is arranged to be upwardly/downwardly spaced apart from and intersect with the electrode piece 54*d*, the electrode piece 53*c* is arranged to be upwardly/downwardly spaced apart from and intersect with the electrode piece 54*a*, and the electrode piece 53*d* is arranged to be upwardly/downwardly spaced apart from and intersect with the electrode piece 54*b*.

In addition, the unitary unit 59*b* (FIG. 11A) includes the resistor arms Ra and Rc which extend in parallel with each other toward the top right of the drawing and the resistor arms Rb and Rd which extend in parallel with each other toward the bottom right of the drawing, and includes an intersecting part 59*b*$_0$ where the resistor arms Ra and Rc are arranged in a direction in which the resistor arms Ra and Rc intersect with the resistor arms Rb and Rd and where the resistor arms Ra and Rc alternately intersect with the resistor arms Rb and Rd upwardly/downwardly. An angle at which the resistor arms Ra and Rc intersect with the resistor arms Rb and Rd may be 90 degrees. In the intersecting part 59*b*$_0$, the electrode piece 55*a* is arranged to be upwardly/downwardly spaced apart from and intersect with the electrode piece 52*d*, the electrode piece 54*a* is arranged to be upwardly/downwardly spaced apart from and intersect with the electrode piece 53*b*, the electrode piece 54*c* is arranged to be upwardly/downwardly spaced apart from and intersect with the electrode piece 53*d*, and the electrode piece 55*c* is arranged to be upwardly/downwardly spaced apart from and intersect with the electrode piece 52*b*. As a result, the resistor arms Ra to Rd can be assembled on one surface in a four-braid pattern and disposed in a limited region.

Furthermore, outside the intersecting part 59*b*$_0$, such as a coupling part between the unitary units 59*a* and 59*b* or a coupling part between the unitary units 59*a* and 59*b* and the terminals VDD, GND, NP1, and NP2, the electrode piece 54*a* is arranged to be upwardly/downwardly spaced apart from and intersect with the electrode piece 53*c*, the electrode piece 54*b* is arranged to be upwardly/downwardly spaced apart from and intersect with the electrode piece 53*d*, the electrode piece 54*c* is arranged to be upwardly/downwardly spaced apart from and intersect with the electrode piece 53*a*, and the electrode piece 54*d* is arranged to be upwardly/downwardly spaced apart from and intersect with the electrode piece 53*b*.

It should be noted that the resistor arm Ra is arranged with a partial arm in the unitary unit 59*a* (see FIG. 10A), which includes two electrode pieces 53*a* and one electrode piece 52*a* between them, being oriented in the +X and −Y directions, and with a partial arm in the unitary unit 59*b* (see FIG. 11A) connected to the partial arm in the unitary unit 59*a*, the unitary unit 59*b* which includes two electrode pieces 54*a* and one electrode piece 55*a* between them, being oriented in the +X and +Y directions, in array sequence via the plurality of magneto resistive elements 51*a*. Here, the electrode piece 53*a*, the electrode piece 52*a*, the electrode piece 53*a*, the electrode piece 54*a*, the electrode piece 55*a*, and the electrode piece 54*a* which are successively linked via the magneto resistive elements 51*a* respectively intersect with the electrode piece 54*c*, the electrode piece 55*d*, the electrode piece 54*b*, the electrode piece 53*c*, the electrode piece 52*d*, and the electrode piece 53*b*.

In addition, the resistor arm Rb is arranged with a partial arm in the unitary unit 59*a* (see FIG. 10A), which includes two electrode pieces 54*b* and one electrode piece 55*b* between them, being oriented in the +X and +Y directions, and with a partial arm in the unitary unit 59*b* (see FIG. 11A) connected to the partial arm in the unitary unit 59*a*, the unitary unit 59*b* which includes two electrode pieces 53*b* and one electrode piece 52*b* between them, being oriented in the +X and −Y directions, in array sequence via the plurality of magneto resistive elements 51*b*. Here, the electrode piece 54*b*, the electrode piece 55*b*, the electrode piece 54*b*, the electrode piece 53*b*, the electrode piece 52*b*, and the electrode piece 53*b* which are successively linked via the magneto resistive elements 51*b* respectively intersect with the electrode piece 53*a*, the electrode piece 52*c*, the electrode piece 53*d*, the electrode piece 54*a*, the electrode piece 55*c*, and the electrode piece 54*d*.

In addition, the resistor arm Rc is arranged with a partial arm in the unitary unit 59*a* (see FIG. 10A), which includes two electrode pieces 53*c* and one electrode piece 52*c* between them, being oriented in the +X and −Y directions, and with a partial arm in the unitary unit 59*b* (see FIG. 11A) connected to the partial arm in the unitary unit 59*a*, the unitary unit 59*b* which includes two electrode pieces 54*c* and one electrode piece 55*c* between them, being oriented in the +X and +Y directions, in array sequence via the plurality of magneto resistive elements 51*c*. Here, the electrode piece 53c, the electrode piece 52c, the electrode piece 53c, the electrode piece 54c, the electrode piece 55c, and the electrode piece 54c which are successively linked via the magneto resistive elements 51c respectively intersect with the electrode piece 54d, the electrode piece 55b, the electrode piece 54a, the electrode piece 53d, the electrode piece 52b, and the electrode piece 53a.

In addition, the resistor arm Rd is arranged with a partial arm in the unitary unit 59a (see FIG. 10A), which includes two electrode pieces 54d and one electrode piece 55d between them, being oriented in the +X and +Y directions, and with a partial arm in the unitary unit 59b (see FIG. 11A) connected to the partial arm in the unitary unit 59a, the unitary unit 59b which includes two electrode pieces 53d and one electrode piece 52d between them, being oriented in the +X and −Y directions, in array sequence via the plurality of magneto resistive elements 51d. Here, the electrode piece 54d, the electrode piece 55d, the electrode piece 54d, the electrode piece 53d, the electrode piece 52d, and the electrode piece 53d which are successively linked via the magneto resistive elements 51d respectively intersect with the electrode piece 53b, the electrode piece 52a, the electrode piece 53c, the electrode piece 54b, the electrode piece 55a, and the electrode piece 54c.

Furthermore, lengths of the two electrode pieces 53a included in the partial arm in the unitary unit 59a of the resistor arm Ra and of the two electrode pieces 54a included in the partial arm in the unitary unit 59b are equal to each other. In addition, lengths of the two electrode pieces 54b included in the partial arm in the unitary unit 59a of the resistor arm Rb and of the two electrode pieces 53b included in the partial arm in the unitary unit 59b are equal to each other. Lengths of the two electrode pieces 53c included in the partial arm in the unitary unit 59a of the resistor arm Rc and of the two electrode pieces 54c included in the partial arm in the unitary unit 59b are equal to each other. In addition, lengths of the two electrode pieces 54d included in the partial arm in the unitary unit 59a of the resistor arm Rd and of the two electrode pieces 53d included in the partial arm in the unitary unit 59b are equal to each other. Lengths of these electrode pieces 53a, 54a, 53b, 54b, 53c, 54c, 53d, and 54d are equal to each other. It should be noted that the lengths of the electrode pieces are defined as lengths in directions in which two magneto resistive elements 51a to 51d that are adjacent to each other are connected.

In addition, lengths of the one electrode pieces 52a included in the partial arm in the unitary unit 59a of the resistor arm Ra and of the one electrode pieces 55a included in the partial arm in the unitary unit 59b are equal to each other. In addition, lengths of the one electrode pieces 55b included in the partial arm in the unitary unit 59a of the resistor arm Rb and of the one electrode pieces 52b included in the partial arm in the unitary unit 59b are equal to each other. In addition, lengths of the one electrode pieces 52c included in the partial arm in the unitary unit 59a of the resistor arm Rc and of the one electrode pieces 55c included in the partial arm in the unitary unit 59b are equal to each other. In addition, lengths of the one electrode pieces 55d included in the partial arm in the unitary unit 59a of the resistor arm Rd and of the one electrode piece 52d included in the partial arm in the unitary unit 59b are equal to each other. Lengths of these electrode pieces 52a, 55a, 52b, 55b, 52c, 55c, 52d, and 55d are equal to each other. It should be noted that the lengths of the electrode pieces are defined as lengths in directions in which two magneto resistive elements 51a to 51d that are adjacent to each other are connected.

The resistor arms Ra to Rd are arranged to be shifted in specific directions relative to each other. In both of the unitary units 59a and 59b, the resistor arm Rb is arranged to be shifted in the −X and +Y directions and shifted in the −X and −Y directions (in other words, shifted in the −X direction) with respect to the resistor arm Ra. The resistor arm Rc is arranged to be shifted in the +X and −Y directions and shifted in the +X and +Y directions (in other words, shifted in the +X direction) with respect to the resistor arm Ra. The resistor arms Rb and Rc are arrayed to be shifted in opposite directions with respect to the resistor arm Ra, so that they are arranged symmetrically with respect to a central axis L parallel to the X axis direction. The resistor arm Rd is arranged symmetrically with the resistor arm Ra with respect to the central axis L. As a result, when the resistor arms Ra to Rd are viewed from the X axis direction, the Y axis direction, the Z axis direction, or any direction, a pair of partial loops with equal loop areas and opposite polarities are formed.

It should be noted that the resistor arms Ra to Rd may include one or more unitary units 59a and one or more unitary units 59b, and may include one or more intersecting parts $59a_0$ and one or more intersecting parts $59b_0$ (in total, a plurality of intersecting parts $59a_0$ and $59b_0$). In addition, they may include one or more partial arms of the resistor arms Ra, one or more partial arms of the resistor arms Rb, one or more partial arms of the resistor arms Rc, and one or more partial arms of the resistor arms Rd (in total, a plurality of respective partial arms of the resistor arms Ra to Rd) in the unitary unit 59a, and may include one or more partial arms of the resistor arms Ra, one or more partial arms of the resistor arms Rb, one or more partial arms of the resistor arms Rc, and one or more partial arms of the resistor arms Rd (in total, a plurality of respective partial arms of the resistor arms Ra to Rd) in the unitary unit 59b. In the present embodiment, two unitary units 59a and a unitary unit 59b coupled therebetween are included, so that two intersecting parts $59a_0$ and one intersecting part $59b_0$ are included. Furthermore, an intersecting part similar to the intersecting parts $59a_0$ and $59b_0$ is included between the unitary units 59a and 59b.

Here, the intersecting part $59a_0$ includes a partial loop formed of eight electrode pieces 52a, 53a, 54b, 55b, 52c, 53c, 54d, and 55d when viewed in the Z axis direction, the intersecting part $59b_0$ includes a partial loop formed of eight electrode pieces 54a, 55a, 52b, 53b, 54c, 55c, 52d, and 53d when viewed in the Z axis direction, and coupling the unitary units 59a and 59b forms a partial loop formed of eight electrode pieces 54a, 55a, 54b, 55b, 52c, 53c, 52d, and 53d between the intersecting parts $59a_0$ and $59b_0$. In other words, coupling the unitary units 59a and 59b forms one or more pairs of partial loops with equal loop areas and opposite polarities when viewed in the Z axis direction.

Figure 12A:
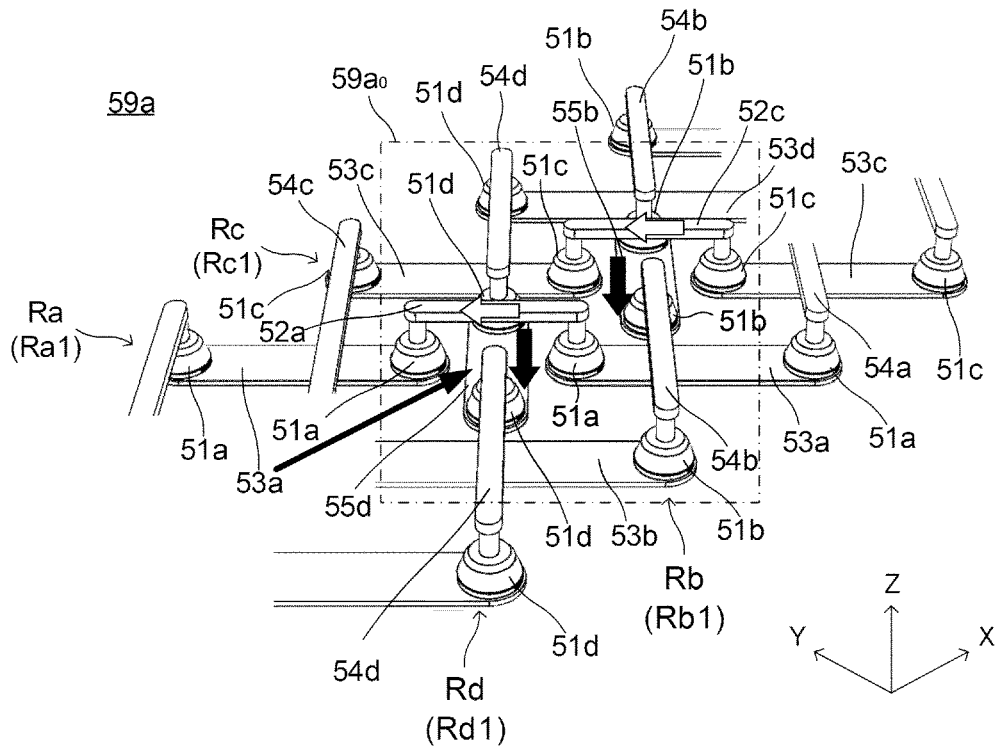
FIG. 12A shows a principle of suppressing a di/dt noise caused by application of an X direction magnetic field.

FIG. 12A shows a principle of suppressing a di/dt noise caused by application of an X direction magnetic field. As an example, a case is considered in which a magnetic flux (solid arrow) oriented in the +X direction is applied to resistor arms Ra to Rd in a unitary unit 59a. When the magnetic flux is applied, induced electromotive forces directed leftward (open arrow), downward (filled arrow), leftward (open arrow), and downward (filled arrow) in the drawing are respectively generated in electrode pieces 52a and 53a, electrode pieces 54b and 55b, electrode pieces 52c and 53c, and electrode pieces 54d and 55d which form partial loops on a central axis L (see FIG. 9) when viewed in the X direction. Here, lengths of the electrode pieces 52a and 53a, the electrode pieces 54b and 55b, the electrode pieces 52c and 53c, and the electrode pieces 54d and 55d (that is, lengths of parts which form the partial loops) are equal. Furthermore, the electrode pieces 52a and 53a and the electrode pieces 52c and 53c are connected via a power source terminal VDD, so that induced electromotive forces generated therein are canceled out. In addition, the electrode pieces 54b and 55b and the electrode pieces 54d and 55d are connected via a ground terminal GND, so that induced electromotive forces generated therein are canceled out.

It should be noted that, also when the X direction magnetic field is applied to other electrode pieces which form partial loops on the central axis L (see FIG. 9), induced electromotive forces are canceled out based on a similar principle.

Figure 12B:
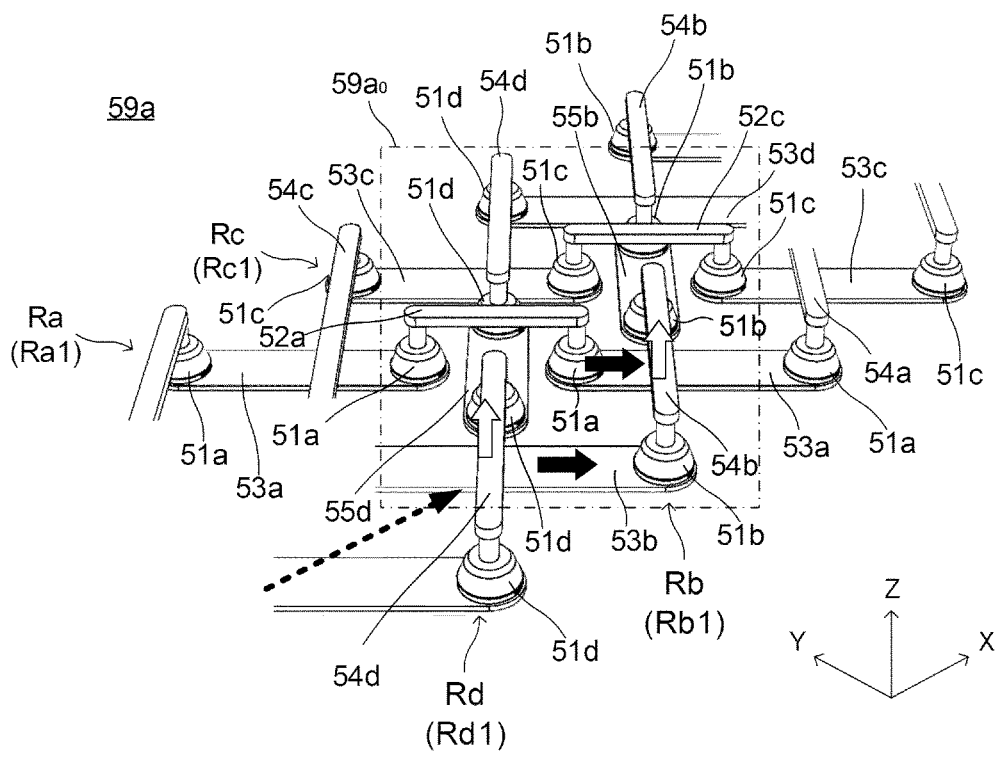
FIG. 12B shows another principle of suppressing the di/dt noise caused by application of the X direction magnetic field.

FIG. 12B shows another principle of suppressing the di/dt noise caused by application of the X direction magnetic field. As an example, a case is considered in which a magnetic flux (dotted arrow) oriented in the +X direction is applied to the resistor arms Ra to Rd in the unitary unit 59a. When the magnetic flux is applied, induced electromotive forces directed rightward (filled arrow), upward (open arrow), rightward (filled arrow), and upward (open arrow) in the drawing are respectively generated in the electrode pieces 52a and 53a, the electrode piece 54b, the electrode piece 53b, and the electrode pieces 54d and 55d which form partial loops on the −Y side of the central axis L (see FIG. 9) when viewed in the X direction. Here, lengths of the electrode pieces 52a and 53a, the electrode piece 54b, the electrode piece 53b, and the electrode pieces 54d and 55d (that is, lengths of parts which form the partial loops) are equal. Furthermore, the electrode pieces 52a and 53a and the electrode piece 54b are connected via an output terminal Np1, so that induced electromotive forces generated therein are canceled out. In addition, the electrode piece 53b and the electrode pieces 54d and 55d are connected via the ground terminal GND, so that induced electromotive forces generated therein are canceled out.

It should be noted that, also when the X direction magnetic field is applied to other electrode pieces which form partial loops on the −Y side of the central axis L (see FIG. 9), induced electromotive forces are canceled out based on a similar principle. In addition, since the resistor arms Ra to Rd are formed symmetrically with respect to the central axis L, induced electromotive forces are canceled out based on a similar principle also in electrode pieces which form partial loops on the +Y side of the central axis L.

Figure 13A:
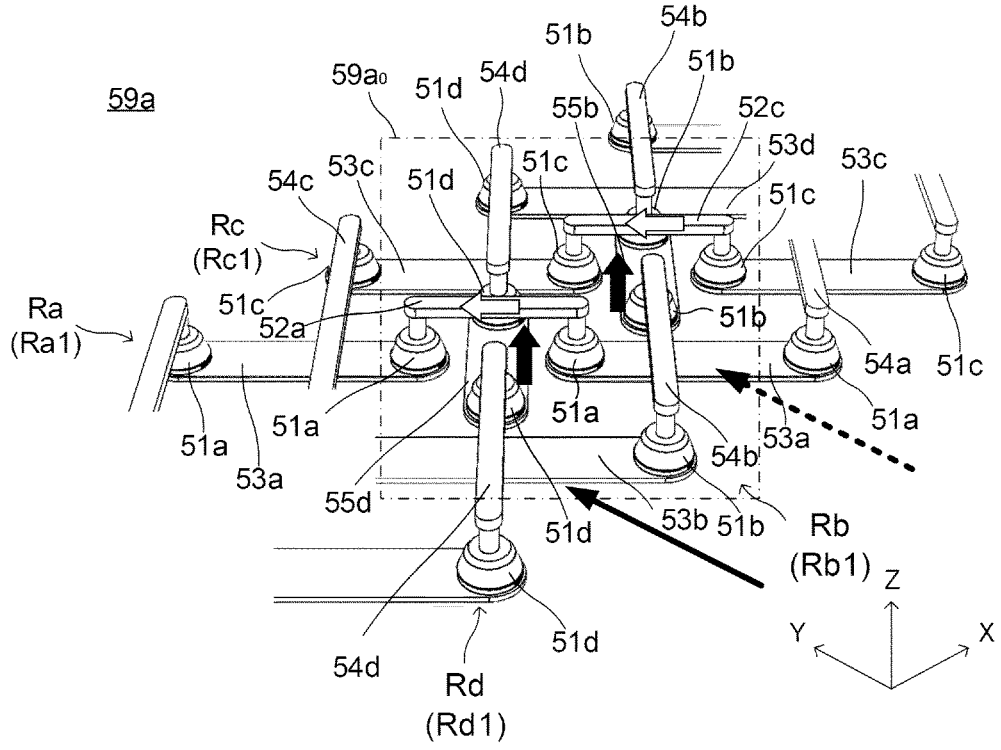
FIG. 13A shows a principle of suppressing a di/dt noise caused by application of a Y direction magnetic field.

FIG. 13A shows a principle of suppressing a di/dt noise caused by application of a Y direction magnetic field. As an example, a case is considered in which magnetic fluxes (solid arrow and dotted arrow) oriented in the +Y direction are applied to resistor arms Ra to Rd in a unitary unit 59a. When a magnetic flux (solid arrow) is applied, induced electromotive forces directed leftward (open arrow) and upward (filled arrow) in the drawing are respectively generated in an electrode piece 52a and an electrode piece 55d which form a partial loop on a central axis L (see FIG. 9) when viewed in the Y direction. When a magnetic flux (dotted arrow) is applied, induced electromotive forces directed leftward (open arrow) and upward (filled arrow) in the drawing are respectively generated in an electrode piece 52c and an electrode piece 55b which form a partial loop on the central axis L (see FIG. 9) when viewed in the Y direction. Here, lengths of the electrode piece 52a and the electrode piece 52c (that is, lengths of parts which form the partial loops) are equal and the electrode piece 52a and the electrode piece 52c are connected via a power source terminal VDD, so that induced electromotive forces generated therein are canceled out. In addition, lengths of the electrode piece 55b and the electrode piece 55d (that is, lengths of parts which form the partial loops) are equal and the electrode piece 55b and the electrode piece 55d are connected via a ground terminal GND, so that induced electromotive forces generated therein are canceled out.

It should be noted that, also when the Y direction magnetic field is applied to other electrode pieces which form partial loops on the central axis L (see FIG. 9), induced electromotive forces are canceled out based on a similar principle.

Figure 13B:
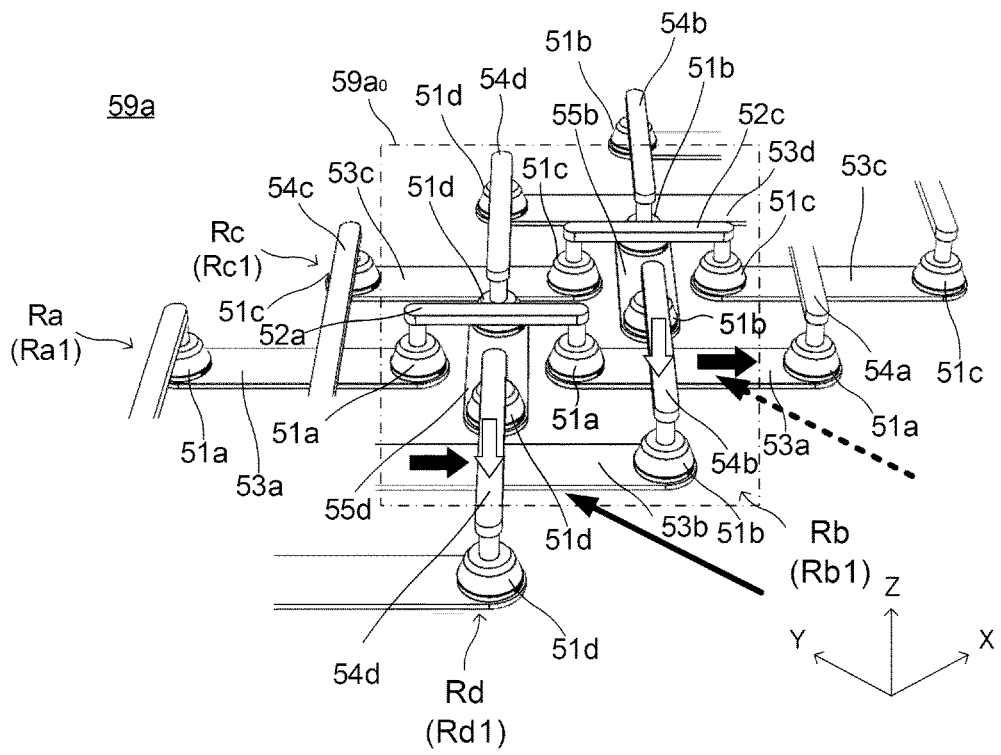
FIG. 13B shows another principle of suppressing the di/dt noise caused by application of the Y direction magnetic field.

FIG. 13B shows another principle of suppressing the di/dt noise caused by application of the Y direction magnetic field. As an example, a case is considered in which magnetic fluxes (solid arrow and dotted arrow) oriented in the +Y direction are applied to the resistor arms Ra to Rd in the unitary unit 59a. When a magnetic flux (solid arrow) is applied, induced electromotive forces directed downward (open arrow) and rightward (filled arrow) in the drawing are respectively generated in an electrode piece 54d and an electrode piece 53b which form a partial loop on the −Y side of the central axis L (see FIG. 9) when viewed in the Y direction. When a magnetic flux (dotted arrow) is applied, induced electromotive forces directed downward (open arrow) and rightward (filled arrow) in the drawing are respectively generated in an electrode piece 54b and an electrode piece 53a which form an adjacent partial loop. Here, lengths of the electrode piece 54b and the electrode piece 54d (that is, lengths of parts which form the partial loops) are equal and the electrode piece 54b and the electrode piece 54d are connected via the ground terminal GND, so that induced electromotive forces generated therein are canceled out. In addition, lengths of the electrode piece 53a and the electrode piece 53b (that is, lengths of parts which form the partial loops) are equal and the electrode piece 53a and the electrode piece 53b are connected via an output terminal Np1, so that induced electromotive forces generated therein are canceled out.

It should be noted that, also when the Y direction magnetic field is applied to other electrode pieces which form partial loops on the −Y side of the central axis L (see FIG. 9), induced electromotive forces are canceled out based on a similar principle. In addition, since the resistor arms Ra to Rd are formed symmetrically with respect to the central axis L, induced electromotive forces are canceled out based on a similar principle also in electrode pieces which form partial loops on the +Y side of the central axis L.

Figure 14A:
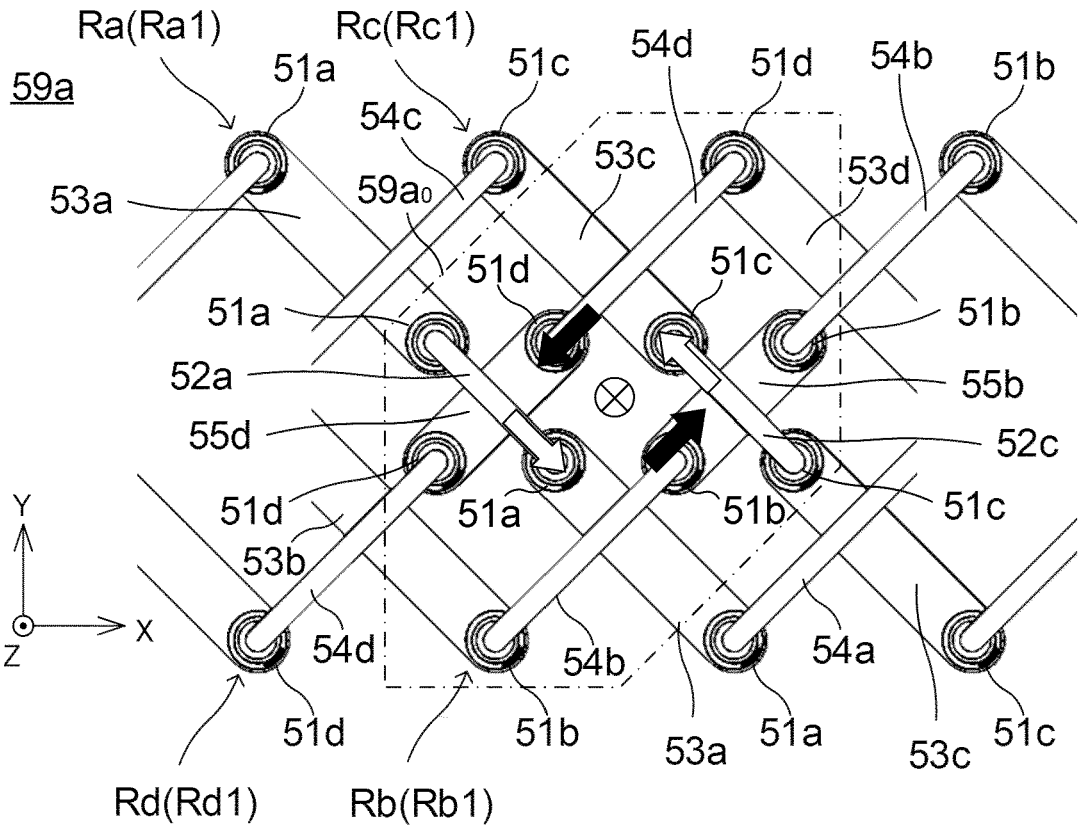
FIG. 14A shows a principle of suppressing a di/dt noise caused by application of a Z direction magnetic field.

FIG. 14A shows a principle of suppressing a di/dt noise caused by application of a Z direction magnetic field. As an example, a case is considered in which a magnetic flux (cross mark) oriented in the −Z direction is applied to resistor arms Ra to Rd in a unitary unit 59a. When the magnetic flux is applied, induced electromotive forces directed downward to the right (open arrow), upward to the right (filled arrow), upward to the left (open arrow), and downward to the left (filled arrow) in the drawing are respectively generated in electrode pieces 52a and 53a, electrode pieces 54b and 55b, electrode pieces 52c and 53c, and electrode pieces 54d and 55d which form partial loops on a central axis L (see FIG. 9) when viewed in the Z direction. Here, lengths of the electrode pieces 52a and 53a, the electrode pieces 54b and 55b, the electrode pieces 52c and 53c, and the electrode pieces 54d and 55d (that is, lengths of parts which form the partial loops) are equal. Furthermore, the electrode pieces 52a and 53a and the electrode pieces 54b and 55b are connected via an output terminal Np1, so that induced electromotive forces generated therein are canceled out. In addition, the electrode pieces 52c and 53c and the electrode pieces 54d and 55d are connected via an output terminal Np2, so that induced electromotive forces generated therein are canceled out.

It should be noted that, also when the Z direction magnetic field is applied to other electrode pieces which form partial loops on the central axis L (see FIG. 9), induced electromotive forces are canceled out based on a similar principle.

Figure 14B:
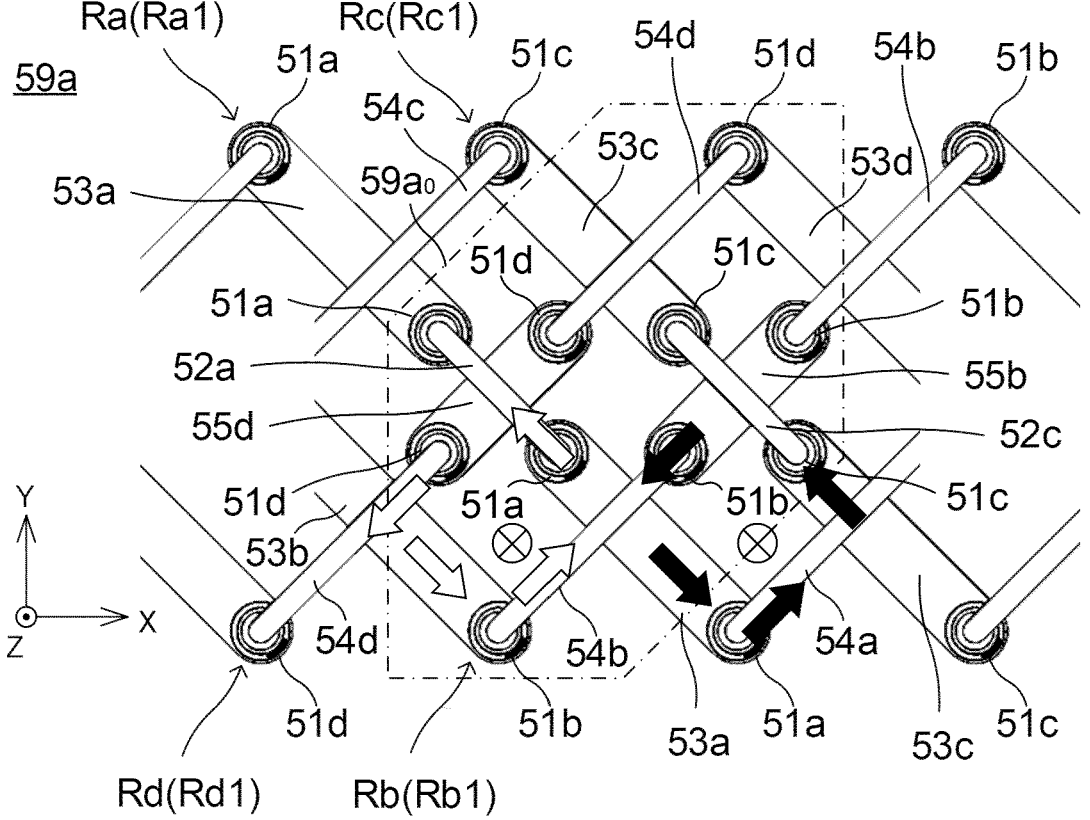
FIG. 14B shows another principle of suppressing of the di/dt noise caused by application of the Z direction magnetic field.

FIG. 14B shows another principle of suppressing of the di/dt noise caused by application of the Z direction magnetic field. As an example, a case is considered in which magnetic fluxes (cross marks on the left and right) oriented in the −Z direction are applied to the resistor arms Ra to Rd in the unitary unit 59a. When a magnetic flux (cross mark on the left) is applied, induced electromotive forces directed upward to the left (open arrow), upward to the right (open arrow), downward to the right (open arrow), and downward to the left (open arrow) in the drawing are respectively generated in the electrode pieces 52a and 53a, the electrode piece 54b, the electrode piece 53b, and the electrode pieces 54d and 55d which form partial loops on the −Y side of the central axis L (see FIG. 9) when viewed in the Z direction. When a magnetic flux (cross mark on the right) is applied, induced electromotive forces directed upward to the left (filled arrow), upward to the right (filled arrow), downward to the right (filled arrow), and downward to the left (filled arrow) in the drawing are respectively generated in the electrode pieces 52c and 53c, the electrode piece 54a, the electrode piece 53a, and the electrode pieces 54b and 55b which form an adjacent partial loop. Here, lengths of the electrode pieces 52a and 53a, the electrode piece 54b, the electrode piece 53b, the electrode pieces 54d and 55d, the electrode pieces 52c and 53c, the electrode piece 54a, the electrode piece 53a, and the electrode pieces 54b and 55b (that is, lengths of parts which form the partial loops) are equal. Furthermore, the electrode pieces 52c and 53c and the electrode pieces 54d and 55d are connected via the output terminal Np2, so that induced electromotive forces generated therein are canceled out. In addition, the electrode pieces 52a and 53a, the electrode piece 54a, the electrode piece 53b, and the electrode pieces 54b and 55b are connected via the output terminal Np1, so that induced electromotive forces generated therein are canceled out.

It should be noted that, also when the Z direction magnetic field is applied to other electrode pieces which form partial loops on the −Y side of the central axis L (see FIG. 9), induced electromotive forces are canceled out based on a similar principle. In addition, since the resistor arms Ra to Rd are formed symmetrically with respect to the central axis L, induced electromotive forces are canceled out based on a similar principle also in electrode pieces which form partial loops on the +Y side of the central axis L.

It should be noted that, in a unitary unit 59b as well, di/dt noises caused by application of an X direction magnetic field, a Y direction magnetic field, and the Z direction magnetic field are suppressed similarly to the unitary unit 59a.

As described above, the resistor arms Ra to Rd are connected in a Wheatstone bridge circuit pattern. One end of the resistor arm Ra (the end at the top right of the drawing) is connected to one end of the resistor arm Rb (the end at the top right of the drawing) to form the output terminal Np1, one end of the resistor arm Rc (the end at the top right of the drawing) is connected to one end of the resistor arm Rd (the end at the top right of the drawing) to form an output terminal Np2, another end of the resistor arm Ra (the end at the bottom left of the drawing) is connected to another end of the resistor arm Rc (the end at the bottom left of the drawing) to form a power source terminal VDD, and another end of the resistor arm Rb (the end at the bottom left of the drawing) is connected to another end of the resistor arm Rd (the end at the bottom left of the drawing) to form a ground terminal GND. Here, magnetic field detection directions of a magneto resistive element 51a and a magneto resistive element 51d are the same, magnetic field detection directions of a magneto resistive element 51b and a magneto resistive element 51c are the same, and the magnetic field detection directions of the magneto resistive element 51a and the magneto resistive element 51d are opposite to the magnetic field detection directions of the magneto resistive element 51b and the magneto resistive element 51c.

When a magnetic field is applied to the magneto resistive elements 51a to 51d included in the resistor arms Ra to Rd of the magnetic sensor 59, for example, when a magnetic field is applied in the same direction as the magnetic field detection directions of the magneto resistive element 51a and the magneto resistive element 51d (a direction opposite to the magnetic field detection directions of the magneto resistive element 51b and the magneto resistive element 51c), resistance values of the resistor arm Ra and the resistor arm Rd respectively including the magneto resistive element 51a and the magneto resistive element 51d decrease, and resistance values of the resistor arm Rb and the resistor arm Rc respectively including the magneto resistive element 51b and the magneto resistive element 51c increase, so that resistance balance between the resistor arms Ra to Rd is disrupted. Therefore, a magnetic field intensity can be detected by inputting a drive voltage to the power source terminal VDD with respect to the ground terminal GND and detecting a differential voltage outputted from between the output terminals Np1 and Np2.

The magnetic sensor 50 according to the second embodiment includes: a first resistor arm Ra having: a plurality of first magneto resistive elements 51a which are arrayed on one surface; a first electrode piece 52a which connects respective upper surfaces of two elements that are adjacent to each other and that are of the plurality of first magneto resistive elements 51a; and a second electrode piece 53a which connects respective lower surfaces of two elements that are adjacent to each other and that are of the plurality of first magneto resistive elements 51a, where the plurality of first magneto resistive elements 51a are alternately connected in array sequence by the first electrode piece 52a and the second electrode piece 53a; a second resistor arm Rb having: a plurality of second magneto resistive elements 51b arrayed on the one surface; a third electrode piece 54b which connects respective upper surfaces of two elements that are adjacent to each other and that are of the plurality of second magneto resistive elements 51b; and a fourth electrode piece 55b which connects respective lower surfaces of two elements that are adjacent to each other and that are of the plurality of second magneto resistive elements 51b, where the plurality of second magneto resistive elements 51b are alternately connected in array sequence by the third electrode piece 54b and the fourth electrode piece 55b; a third resistor arm Rc having: a plurality of third magneto resistive elements 51c arrayed on the one surface; a fifth electrode piece 52c which connects respective upper surfaces of two elements that are adjacent to each other and that are of the plurality of third magneto resistive elements 51c; and a sixth electrode piece 53c which connects respective lower surfaces of two elements that are adjacent to each other and that are of the plurality of third magneto resistive elements 51c, where the plurality of third magneto resistive elements 51*c* are alternately connected in array sequence by the fifth electrode piece 52*c* and the sixth electrode piece 53*c*; and a fourth resistor arm Rd having: a plurality of fourth magneto resistive elements 51*d* arrayed on the one surface; a seventh electrode piece 54*d* which connects respective upper surfaces of two elements that are adjacent to each other and that are of the plurality of fourth magneto resistive elements 51*d*; and an eighth electrode piece 55*d* which connects respective lower surfaces of two elements that are adjacent to each other and that are of the plurality of fourth magneto resistive elements 51*d*, where the plurality of fourth magneto resistive elements 51*d* are alternately connected in array sequence by the seventh electrode piece 54*d* and the eighth electrode piece 55*d*, where the magnetic sensor 50 includes an intersecting part in which the first electrode piece 52*a* is arranged to be upwardly/downwardly spaced apart from and intersect with the eighth electrode piece 55*d*, the second electrode piece 53*a* is arranged to be upwardly/downwardly spaced apart from and intersect with the third electrode piece 54*b*, the fifth electrode piece 52*c* is arranged to be upwardly/downwardly spaced apart from and intersect with the fourth electrode piece 55*b*, and the sixth electrode piece 53*c* is arranged to be upwardly/downwardly spaced apart from and intersect with the seventh electrode piece 54*d*.

According to this, the first resistor arm Ra having the first magneto resistive elements 51*a* which are arrayed on one surface, the second resistor arm Rb having the second magneto resistive elements 51*b* which are arrayed on the same one surface, the third resistor arm Rc having the third magneto resistive element 51*c* which are arrayed on the same one surface, and the fourth resistor arm Rd having the fourth magneto resistive element 51*d* which are arrayed on the same one surface are assembled in a four-braid pattern, with the first electrode piece 52*a* which connects upper surfaces of two first magneto resistive elements 51*a* that are adjacent being upwardly/downwardly spaced apart from and intersect with the eighth electrode piece 55*d* which connects lower surfaces of two fourth magneto resistive elements 51*d* that are adjacent, with the second electrode piece 53*a* which connects lower surfaces of two first magneto resistive elements 51*a* that are adjacent being upwardly/downwardly spaced apart from and intersect with the third electrode piece 54*b* which connects upper surfaces of two second magneto resistive elements 51*b* that are adjacent, with the fifth electrode piece 52*c* which connects upper surfaces of two third magneto resistive elements 51*c* that are adjacent being upwardly/downwardly spaced apart from and intersect with the fourth electrode piece 55*b* which connects lower surfaces of two second magneto resistive elements 52*d* that are adjacent, and with the sixth electrode piece 53*c* which connects lower surfaces of two third magneto resistive elements 51*c* that are adjacent being upwardly/downwardly spaced apart from and intersect with the seventh electrode piece 54*d* which connects upper surfaces of two fourth magneto resistive elements 51*d* that are adjacent, so that one or more pairs of partial loops with opposite polarities are formed in the resistor arms Ra to Rd, and it is possible to cancel out the noise caused by the induced electromotive force for a time when the magnetic field is applied. Furthermore, the resistor arms Ra to Rd having a plurality of partial loops having a small size with respect to their arm lengths can suppress a common-mode noise caused by a gradient of the magnetic field intensity in a length range of the resistor arms Ra to Rd.

The magnetic sensor 50 according to the second embodiment includes: a first resistor arm Ra having: a plurality of first magneto resistive elements 51*a* which are arrayed on one surface; a ninth electrode piece 54*a* which connects respective upper surfaces of two elements that are adjacent to each other and that are of the plurality of first magneto resistive elements 51*a*; and a tenth electrode piece 55*a* which connects respective lower surfaces of two elements that are adjacent to each other and that are of the plurality of first magneto resistive elements 51*a*, where the plurality of first magneto resistive elements 51*a* are alternately connected in array sequence by the ninth electrode piece 54*a* and the tenth electrode piece 55*a*; a second resistor arm Rb having: a plurality of second magneto resistive elements 51*b* arrayed on the one surface; a eleventh electrode piece 52*b* which connects respective upper surfaces of two elements that are adjacent to each other and that are of the plurality of second magneto resistive elements 51*b*; and a twelfth electrode piece 53*b* which connects respective lower surfaces of two elements that are adjacent to each other and that are of the plurality of second magneto resistive elements 51*b*, where the plurality of second magneto resistive elements 51*b* are alternately connected in array sequence by the eleventh electrode piece 52*b* and the twelfth electrode piece 53*b*, a third resistor arm Rc having: a plurality of third magneto resistive elements 51*c* arrayed on the one surface; a thirteenth electrode piece 54*c* which connects respective upper surfaces of two elements that are adjacent to each other and that are of the plurality of third magneto resistive elements 51*c*; and a fourteenth electrode piece 55*c* which connects respective lower surfaces of two elements that are adjacent to each other and that are of the plurality of third magneto resistive elements 51*c*, where the plurality of third magneto resistive elements 51*c* are alternately connected in array sequence by the thirteenth electrode piece 54*c* and the fourteenth electrode piece 55*c*; and a fourth resistor arm Rd having: a plurality of fourth magneto resistive elements 51*d* arrayed on the one surface; a fifteenth electrode piece 52*d* which connects respective upper surfaces of two elements that are adjacent to each other and that are of the plurality of fourth magneto resistive elements 51*d*; and an sixteenth electrode piece 53*d* which connects respective lower surfaces of two elements that are adjacent to each other and that are of the plurality of fourth magneto resistive elements 51*d*, where the plurality of fourth magneto resistive elements 51*d* are alternately connected in array sequence by the fifteenth electrode piece 52*d* and the sixteenth electrode piece 53*d*, where the magnetic sensor 50 includes an intersecting part in which the ninth electrode piece 54*a* is arranged to be upwardly/downwardly spaced apart from and intersect with the sixteenth electrode piece 53*b*, the tenth electrode piece 55*a* is arranged to be upwardly/downwardly spaced apart from and intersect with the eleventh electrode piece 52*d*, the thirteenth electrode piece 54*c* is arranged to be upwardly/downwardly spaced apart from and intersect with the twelfth electrode piece 53*d*, and the fourteenth electrode piece 55*c* is arranged to be upwardly/downwardly spaced apart from and intersect with the fifteenth electrode piece 52*b*.

According to this, the resistor arms Ra to Rd are assembled in a four-braid pattern, so that one or more pairs of partial loops with opposite polarities are formed in the resistor arms Ra to Rd, and it is possible to cancel out the noise caused by the induced electromotive force for a time when the magnetic field is applied. Furthermore, the resistor arms Ra to Rd having a plurality of partial loops having a small size with respect to their arm lengths can suppress a common-mode noise caused by a gradient of the magnetic field intensity in a length range of the resistor arms Ra to Rd.

The current detection device 100 according to the second embodiment includes: a conductor 24 through which a to-be-measured current flows; and the magnetic sensor 59 which is arranged on the conductor 24 or near the conductor 24. As a result, it is possible to suppress the di/dt noise caused by the induced electromotive force and the common-mode noise caused by the gradient of the magnetic field intensity.

It should be noted that, in the magnetic sensor 59 according to the second embodiment, the resistor arm Ra, the resistor arm Rc, the resistor arm Rd, and the resistor arm Rb are successively arranged in the +X direction and assembled in a four-braid pattern, but an arrangement order of the resistor arm Ra, the resistor arm Rc, the resistor arm Rd, and the resistor arm Rb is not limited to this, and they may be arranged in any order.

MODIFIED EXAMPLE

Figure 15A:
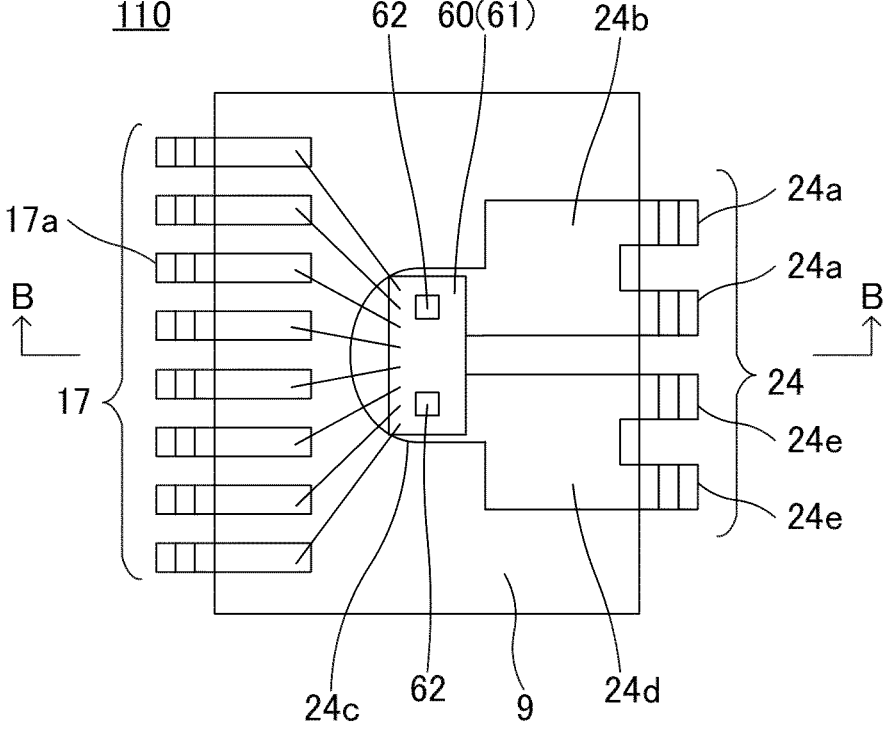
FIG. 15A shows an internal configuration of a current detection device according to a modified example in a top view.
Figure 15B:
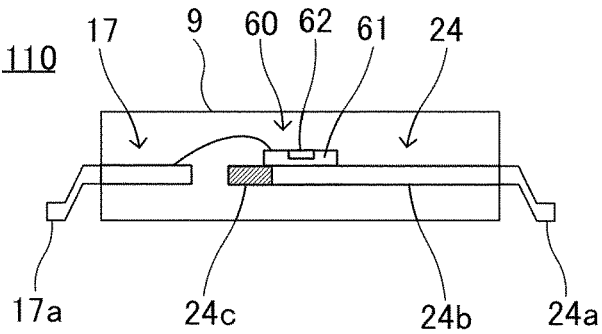
FIG. 15B shows the internal configuration of the current detection device according to the modified example in a side view.

FIG. 15A and FIG. 15B respectively show an internal configuration of a current detection device 110 according to a modified example through a package 9 in a top view and a side view. Here, FIG. 15B shows a cross-sectional structure of the current detection device 110 with respect to a reference line in FIG. 15A. It should be noted that the upward/downward direction in FIG. 15A is defined as the longitudinal direction, the rightward/leftward direction in FIG. 15A and FIG. 15B is defined as the lateral direction, and the upward/downward direction in FIG. 15B is defined as the height direction. The current detection device 110 is a sensor which measures an amount of current by using a magnetic sensor 60 to detect a magnetic field generated around a conductor 24 as a result of a to-be-measured current flowing through the conductor 24, and can suppress especially a di/dt noise due to an induced electromotive force and/or a differential amplification noise caused by spread of a magnetic field distribution. The current detection device 110 includes the package 9, a plurality of device terminals 17, the conductor 24, and the magnetic sensor 60.

The package 9 is a member which encapsulates therein and protects each portion constituting the current detection device 110, except for the plurality of device terminals 17 and respective terminal portions of the conductor 24. The package 9 can be formed of a material similar to that of the package 9 in the current detection device 100 according to the first embodiment.

The plurality of device terminals 17 are secondary conductors for outputting, to an external device, a detection result of the to-be-measured current outputted from the magnetic sensor 60. In the present example, as one example, eight device terminals 17 are arrayed at regular intervals on a left side of the package 9 with their longitudinal sides being oriented in the lateral direction. The plurality of device terminals 17 are formed similarly to those in the current detection device 100 according to the first embodiment.

The conductor 24 is a primary conductor which forms a current path through which the to-be-measured current flows. The conductor 24 is formed similarly to that in the current detection device 100 according to the first embodiment, and its terminal portions 24a and 24e are arranged on a right side of the package 9, and two legs included in a curved portion 24c are arranged at a center of the package 9.

The magnetic sensor 60 is a sensor which detects a magnetic field generated by the to-be-measured current passed through the conductor 24. As one example, the magnetic sensor 60 is configured to detect a longitudinal magnetic field (one example of a horizontal magnetic field) generated around the conductor 24, and includes a substrate 61 and two sensor bodies 62.

The substrate 61 is a plate-like member which supports the two sensor bodies 62. The substrate 61 is formed of, for example, silicon (Si), and has a plurality of wiring lines (not shown) laid on its upper surface.

The two sensor bodies 62 are sensors which detect the magnetic field generated by the to-be-measured current passed through the conductor 24. A sensor body 62 includes four resistor arms Ra to Rd which are connected in a Wheatstone bridge circuit pattern similarly to the magnetic sensor 50 according to the first embodiment or the magnetic sensor 59 according to the second embodiment by using magneto resistive elements 51 arrayed on the substrate 61. The two sensor bodies 62 are arranged on the substrate 61 to be longitudinally spaced apart from each other, and their respective power source terminals VDD, ground terminals GND, and output terminals Np1 and Np2 are connected to a wiring line on the substrate 61.

The magnetic sensor 60 is arranged on the curved portion 24c of the conductor 24. As a result, the two sensor bodies 62 are respectively arranged on the two legs of the curved portion 24c, and the wiring line on the substrate 61 connected to the respective power source terminals VDD, ground terminals GND, and output terminals Np1 and Np2 is connected to the device terminals 17 through wire bonding. As a result, it is possible to apply a drive voltage to the two sensor bodies 62 via the device terminals 17 and to output their respective output voltages.

The current detection device 110 is manufactured by: pressing one piece of metal plate to form a pattern of the plurality of device terminals 17 and the conductor 24; performing a step providing process on the pattern to form terminal portions 17a on the plurality of device terminals 17 and the terminal portions 24a and 24e on the conductor 24; arranging the magnetic sensor 60 on the curved portion 24c of the conductor 24; connecting the magnetic sensor 60 to the device terminals 17 through wire bonding; molding the pattern except for the frame as well as the terminal portions 17a of the plurality of device terminals 17 and the terminal portions 24a and 24e of the conductor 24 coupled to the frame, to form the package 9; and finally cutting off the frame exposed on the outside of the package 9 from the pattern.

While the present invention has been described by way of the embodiments, the technical scope of the present invention is not limited to the above-described embodiments. It is apparent to persons skilled in the art that various alterations or improvements can be made to the above-described embodiments. It is also apparent from the description of the claims that embodiments added with such alterations or improvements can be included in the technical scope of the present invention.

It should be noted that the operations, procedures, steps, stages, and the like of each processing performed by an apparatus, system, program, and method shown in the claims, specification, or drawings can be realized in any order as long as the order is not indicated by "prior to," "before," or the like and as long as the output from a previous processing is not used in a later processing. Even if the operation flow is described using phrases such as "first" or "next" for the sake of convenience in the claims, specification, or drawings, it does not necessarily mean that the process must be performed in this order.

EXPLANATION OF REFERENCES

9: package, 10: base, 11: body, 12, 14: protruding portion, 15, 16, 17: device terminal, 15a, 16a, 17a: terminal portion, 18: insulating member, 24: conductor, 24a: current terminal (terminal portion), 24a, 24e: terminal portion, 24b, 24d: barrel, 24c: curved portion, 24e: current terminal, 44: signal processing device, 50: magnetic sensor, 50a, 50a$_2$, 50c, 50c$_2$: intersecting part, 51: magneto resistive element, 51a, 51b, 51c, 51d: magneto resistive element (first magneto resistive element, second magneto resistive element, third magneto resistive element, fourth magneto resistive element), 51o: fixed layer, 51p: tunnel layer, 51q: free layer, 51r: cap layer, 51s: electrode rod, 52, 53: electrode piece, 52a, 53a, 54a, and 55a: electrode piece (first electrode piece, second electrode piece, ninth electrode piece, tenth electrode piece), 52b, 53b, 54b, and 55b: electrode piece (fifteenth electrode piece, sixteenth electrode piece, third electrode piece, fourth electrode piece), 52c, 53c, 54c, and 55c: electrode piece (fifth electrode piece, sixth electrode piece, thirteenth electrode piece, fourteenth electrode piece), 52d, 53d, 54d, and 55d: electrode piece (eleventh electrode piece, twelfth electrode piece, seventh electrode piece, eighth electrode piece), 59: magnetic sensor, 59a, 59b: unitary unit, 59a$_0$, 59b$_0$: intersecting part, 60: magnetic sensor, 61: substrate, 62: sensor body, 100: current detection device, GND: ground terminal, L: central axis, Np1, Np2: output terminal, Ra, Rb, Rc, Rd: resistor arm (first resistor arm, second resistor arm, third resistor arm, fourth resistor arm), VDD: power source terminal.

What is claimed is:

1. A magnetic sensor comprising:
a first resistor arm having: a plurality of first magneto resistive elements which are arrayed on one surface; a first electrode piece which connects respective upper surfaces of two first magneto resistive elements that are adjacent to each other and that are of the plurality of first magneto resistive elements; and a second electrode piece which connects respective lower surfaces of two first magneto resistive elements that are adjacent to each other and that are of the plurality of first magneto resistive elements, wherein the plurality of first magneto resistive elements are alternately connected in array sequence by the first electrode piece and the second electrode piece; and
a second resistor arm having: a plurality of second magneto resistive elements which are arrayed on the one surface; a third electrode piece which connects respective upper surfaces of two second magneto resistive elements that are adjacent to each other and that are of the plurality of second magneto resistive elements; and a fourth electrode piece which connects respective lower surfaces of two second magneto resistive elements that are adjacent to each other and that are of the plurality of second magneto resistive elements, wherein the plurality of second magneto resistive elements are alternately connected in array sequence by the third electrode piece and the fourth electrode piece, wherein
the magnetic sensor includes a first intersecting part in which the first electrode piece is arranged to be vertically spaced apart from and intersect with the fourth electrode piece and the second electrode piece is arranged to be vertically spaced apart from and intersect with the third electrode piece.

2. The magnetic sensor according to claim 1, wherein, in the first intersecting part, the first electrode piece and the third electrode piece are arranged to be parallel to each other, the second electrode piece and the fourth electrode piece are arranged to be parallel to each other, and the first electrode piece and the third electrode piece are arranged in a direction in which the first electrode piece and the third electrode piece intersect with the second electrode piece and the fourth electrode piece.

3. The magnetic sensor according to claim 2, wherein an angle at which the first electrode piece and the third electrode piece intersect with the second electrode piece and the fourth electrode piece is 90 degrees.

4. The magnetic sensor according to claim 1, wherein
a length of the first electrode piece in a direction in which the two first magneto resistive elements that are adjacent to each other are connected and a length of the third electrode piece in a direction in which the two second magneto resistive elements that are adjacent to each other are connected are equal to each other, and
a length of the second electrode piece in a direction in which the two first magneto resistive elements that are adjacent to each other are connected and a length of the fourth electrode piece in a direction in which the two second magneto resistive elements that are adjacent to each other are connected are equal to each other.

5. The magnetic sensor according to claim 4, wherein
the first resistor arm has an even number of first electrode pieces, each first electrode piece being identical to the first electrode piece, and an even number of second electrode pieces, each second electrode piece being identical to the second electrode piece, and
the second resistor arm has an even number of third electrode pieces, each third electrode piece being identical to the third electrode piece, and an even number of fourth electrode pieces, each fourth electrode piece being identical to the fourth electrode piece.

6. The magnetic sensor according to claim 1, further comprising:
a third resistor arm having: a plurality of third magneto resistive elements which are arrayed on the one surface; a fifth electrode piece which connects respective upper surfaces of two third magneto resistive elements that are adjacent to each other and that are of the plurality of third magneto resistive elements; and a sixth electrode piece which connects respective lower surfaces of two third magneto resistive elements that are adjacent to each other and that are of the plurality of third magneto resistive elements, wherein the plurality of third magneto resistive elements are alternately connected in array sequence by the fifth electrode piece and the sixth electrode piece; and
a fourth resistor arm having: a plurality of fourth magneto resistive elements which are arrayed on the one surface; a seventh electrode piece which connects respective upper surfaces of two fourth magneto resistive elements that are adjacent to each other and that are of the plurality of fourth magneto resistive elements; and an eighth electrode piece which connects respective lower surfaces of two fourth magneto resistive elements that are adjacent to each other and that are of the plurality of fourth magneto resistive elements, wherein the plurality of fourth magneto resistive elements are alternately connected in array sequence by the seventh electrode piece and the eighth electrode piece, wherein
the magnetic sensor includes a second intersecting part in which the fifth electrode piece is arranged to be vertically spaced apart from and intersect with the eighth electrode piece and the sixth electrode piece is arranged to be upwardly/downwardly spaced apart from and intersect with the seventh electrode piece.

7. The magnetic sensor according to claim 6, wherein, in the second intersecting part, the fifth electrode piece and the seventh electrode piece are arranged to be parallel to each other, the sixth electrode piece and the eighth electrode piece are arranged to be parallel to each other, and the fifth electrode piece and the seventh electrode piece are arranged in a direction in which the fifth electrode piece and the seventh electrode piece intersect with the sixth electrode piece and the eighth electrode piece.

8. The magnetic sensor according to claim 7, wherein an angle at which the fifth electrode piece and the seventh electrode piece intersect with the sixth electrode piece and the eighth electrode piece is 90 degrees.

9. The magnetic sensor according to claim 6, wherein
a length of the fifth electrode piece in a direction in which the two third magneto resistive elements that are adjacent to each other are connected and a length of the seventh electrode piece in a direction in which the two fourth magneto resistive elements that are adjacent to each other are connected are equal to each other, and
a length of the sixth electrode piece in a direction in which the two third magneto resistive elements that are adjacent to each other are connected and a length of the eighth electrode piece in a direction in which the two fourth magneto resistive elements that are adjacent to each other are connected are equal to each other.

10. The magnetic sensor according to claim 9, wherein
the third resistor arm has an even number of fifth electrode pieces, each fifth electrode piece being identical to the fifth electrode piece, and an even number of sixth electrode pieces, each sixth electrode piece being identical to the sixth electrode piece, and
the fourth resistor arm has an even number of seventh electrode pieces, each seventh electrode piece being identical to the seventh electrode piece, and an even number of eighth electrode pieces, each eighth electrode piece being identical to the eighth electrode piece.

11. The magnetic sensor according to claim 6, wherein
one end of the first resistor arm is connected to one end of the second resistor arm,
one end of the third resistor arm is connected to one end of the fourth resistor arm,
another end of the first resistor arm is connected to another end of the third resistor arm,
another end of the second resistor arm is connected to another end of the fourth resistor arm, and
magnetic field detection directions of the plurality of first magneto resistive elements and the plurality of fourth magneto resistive elements are the same, magnetic field detection directions of the plurality of second magneto resistive elements and the plurality of third magneto resistive elements are the same, and the magnetic field detection directions of the plurality of first magneto resistive elements and the plurality of fourth magneto resistive elements are opposite to the magnetic field detection directions of the plurality of second magneto resistive elements and the plurality of third magneto resistive elements.

12. The magnetic sensor according to claim 6, wherein the plurality of first magneto resistive elements, the plurality of second magneto resistive elements, the plurality of third magneto resistive elements, and the plurality of fourth magneto resistive elements are tunneling magneto resistive elements.

13. A current detection device comprising:
a conductor through which a to-be-measured current flows; and
the magnetic sensor according to claim 1, which is arranged on the conductor or near the conductor.

14. A magnetic sensor comprising:
a first resistor arm having: a plurality of first magneto resistive elements which are arrayed on one surface; a first electrode piece which connects respective upper surfaces of two first magneto resistive elements that are adjacent to each other and that are of the plurality of first magneto resistive elements; and a second electrode piece which connects respective lower surfaces of two first magneto resistive elements that are adjacent to each other and that are of the plurality of first magneto resistive elements, wherein the plurality of first magneto resistive elements are alternately connected in array sequence by the first electrode piece and the second electrode piece;
a second resistor arm having: a plurality of second magneto resistive elements which are arrayed on the one surface; a third electrode piece which connects respective upper surfaces of two second magneto resistive elements that are adjacent to each other and that are of the plurality of second magneto resistive elements; and a fourth electrode piece which connects respective lower surfaces of two second magneto resistive elements that are adjacent to each other and that are of the plurality of second magneto resistive elements, wherein the plurality of second magneto resistive elements are alternately connected in array sequence by the third electrode piece and the fourth electrode piece;
a third resistor arm having: a plurality of third magneto resistive elements which are arrayed on the one surface; a fifth electrode piece which connects respective upper surfaces of two third magneto resistive elements that are adjacent to each other and that are of the plurality of third magneto resistive elements; and a sixth electrode piece which connects respective lower surfaces of two third magneto resistive elements that are adjacent to each other and that are of the plurality of third magneto resistive elements, wherein the plurality of third magneto resistive elements are alternately connected in array sequence by the fifth electrode piece and the sixth electrode piece; and
a fourth resistor arm having: a plurality of fourth magneto resistive elements which are arrayed on the one surface; a seventh electrode piece which connects respective upper surfaces of two fourth magneto resistive elements that are adjacent to each other and that are of the plurality of fourth magneto resistive elements; and an eighth electrode piece which connects respective lower surfaces of two fourth magneto resistive elements that are adjacent to each other and that are of the plurality of fourth magneto resistive elements, wherein the plurality of fourth magneto resistive elements are alternately connected in array sequence by the seventh electrode piece and the eighth electrode piece, wherein
the magnetic sensor includes an intersecting part in which the first electrode piece is arranged to be vertically spaced apart from and intersect with the eighth electrode piece, the second electrode piece is arranged to be vertically spaced apart from and intersect with the third electrode piece, the fifth electrode piece is arranged to be vertically spaced apart from and intersect with the fourth electrode piece, and the sixth electrode piece is arranged to be vertically spaced apart from and intersect with the seventh electrode piece.

15. The magnetic sensor according to claim 14, wherein, in the intersecting part, the first resistor arm and the third resistor arm are arranged to be parallel to each other, the second resistor arm and the fourth resistor arm are arranged to be parallel to each other, and the first resistor arm and the third resistor arm are arranged in a direction in which the first resistor arm and the third resistor arm intersect with the second resistor arm and the fourth resistor arm.

16. The magnetic sensor according to claim 15, wherein an angle at which the first resistor arm and the third resistor arm intersect with the second resistor arm and the fourth resistor arm is 90 degrees.

17. The magnetic sensor according to claim 14, wherein the first resistor arm is arranged with a first partial arm, which has two second electrode pieces, each second electrode piece being identical to the second electrode piece, and one first electrode piece between them, one said first electrode piece being identical to the first electrode piece, being oriented in a first direction, and with a second partial arm connected to the first partial arm, the second partial arm which has two first electrode pieces, each first electrode piece being identical to the first electrode piece, and one second electrode piece between them, one said second electrode piece being identical to the second electrode piece, being oriented in a second direction intersecting with the first direction, in array sequence via the plurality of first magneto resistive elements.

18. The magnetic sensor according to claim 17, wherein the two second electrode pieces included in the first partial arm and the two first electrode pieces included in the second partial arm have mutually equal lengths in a direction in which the two first magneto resistive elements that are adjacent to each other are connected, and the one first electrode piece included in the first partial arm and the one second electrode piece included in the second partial arm have mutually equal lengths in a direction in which the two first magneto resistive elements that are adjacent to each other are connected.

19. The magnetic sensor according to claim 18, wherein the second resistor arm is arranged to be shifted with respect to the first resistor arm in each of the first direction and the second direction, the third resistor arm is arranged to be shifted with respect to the first resistor arm in each of a direction opposite to the first direction and a direction opposite to the second direction and is arranged symmetrically with the second resistor arm with respect to a central axis intersecting with each of the first direction and the second direction, and the fourth resistor arm is arranged symmetrically with the first resistor arm with respect to the central axis.

20. The magnetic sensor according to claim 19, wherein the first resistor arm, the second resistor arm, the third resistor arm, and the fourth resistor arm form one or more pairs of closed loops with equal areas and opposite polarities, for at least one direction of the upward/downward direction, a direction parallel to the central axis, or a direction intersecting with the upward/downward direction and the direction parallel to the central axis.

21. The magnetic sensor according to claim 17, comprising a plurality of first partial arms, each first partial arm being identical to the first partial arm, and a plurality of second partial arms, each second partial arm being identical to the second partial arm.

22. The magnetic sensor according to claim 14, comprising a plurality of intersecting parts, each intersecting part being identical to the intersecting part.

23. The magnetic sensor according to claim 14, wherein one end of the first resistor arm is connected to one end of the second resistor arm, one end of the third resistor arm is connected to one end of the fourth resistor arm, another end of the first resistor arm is connected to another end of the third resistor arm, another end of the second resistor arm is connected to another end of the fourth resistor arm, and magnetic field detection directions of the plurality of first magneto resistive elements and the plurality of fourth magneto resistive elements are the same, magnetic field detection directions of the plurality of second magneto resistive elements and the plurality of third magneto resistive elements are the same, and the magnetic field detection directions of the plurality of first magneto resistive elements and the plurality of fourth magneto resistive elements are opposite to the magnetic field detection directions of the plurality of second magneto resistive elements and the plurality of third magneto resistive elements.

24. The magnetic sensor according to claim 14, wherein the plurality of first magneto resistive elements, the plurality of second magneto resistive elements, the plurality of third magneto resistive elements, and the plurality of fourth magneto resistive elements are tunneling magneto resistive elements.

25. A current detection device comprising:

a conductor through which a to-be-measured current flows; and the magnetic sensor according to claim 14, which is arranged on the conductor or near the conductor.

* * * * *